United States Patent [19]

Okubo et al.

[11] Patent Number: 5,450,494
[45] Date of Patent: Sep. 12, 1995

[54] AUTOMATIC VOLUME CONTROLLING APPARATUS

[75] Inventors: Tadatoshi Okubo; Ken-ichi Taura, both of Nagaokakyo, Japan

[73] Assignee: Mitsubishi Denki Kabushiki Kaisha, Tokyo, Japan

[21] Appl. No.: 102,007

[22] Filed: Aug. 4, 1993

[30] Foreign Application Priority Data

| Aug. 5, 1992 | [JP] | Japan | 4-208927 |
| Feb. 15, 1993 | [JP] | Japan | 5-025213 |
| Feb. 23, 1993 | [JP] | Japan | 5-033314 |
| Jun. 18, 1993 | [JP] | Japan | 5-147561 |

[51] Int. Cl.[6] ............................. H03G 3/24
[52] U.S. Cl. ..................... 381/57; 381/108
[58] Field of Search ............ 381/57, 107, 108, 109, 381/71; 379/388

[56] References Cited

U.S. PATENT DOCUMENTS

| 4,479,237 | 10/1984 | Sugasawa | 381/57 |
| 4,679,240 | 7/1987 | Heide | 381/109 |
| 4,912,758 | 3/1990 | Arbel | 379/388 |

FOREIGN PATENT DOCUMENTS 0319777 6/1989 European Pat. Off. .
60-7848 2/1985 Japan .
3-13762 2/1991 Japan .
4-302204 10/1992 Japan .
5-259779 10/1993 Japan .

*Primary Examiner*—Forester W. Isen

[57] ABSTRACT

An apparatus for automatically controlling the sound volume of a sound producing apparatus based on ambient noise includes a microphone which detects the sound produced by the sound producing apparatus and ambient noise. Adaptive filters approximate, based on signals sent from the sound producing apparatus to speakers thereof, the characteristics of the sound components, relating to the sound produced by an individual speaker of the sound producing apparatus, which are received by the microphone. A subtractor subtracts the output of the adaptive filters from the output of the microphone to obtain a signal representing the ambient noise. The adaptive filters receive the signal representing the ambient noise and use this signal as a coefficient updating signal. A signal converter converts the signal representing ambient noise into an ambient noise level representing the volume of ambient noise. A controller then controls the gain by which amplifiers amplify signals sent from the sound producing apparatus to speakers thereof based on the ambient noise level.

8 Claims, 20 Drawing Sheets

AUTOMATIC VOLUME CONTROLLING APPARATUS

BACKGROUND OF THE INVENTION

1. Field of the Invention

The present invention relates to an automatic volume control for a sound reproducing apparatus used in noisy environments.

2. Description of the Related Art

In an apparatuses possessing sound output means, such as a television set, radio or a tape recorder, it has been attempted to automatically control the volume depending on the level changes in the ambient noise. As for the sound reproducing apparatus used in noisy environments, such as a car radio or a car stereo equipment, it has been attempted to automatically raise the reproducing volume depending on the level of the ambient noise so as to maintain a favorable listening condition even in a noisy situation.

Typical apparatuses are as follows: (a) an apparatus in which a mixed sound of an ambient noise with a speaker sound is detected by a microphone, and the level difference in the detected signal from the signal out of a sound signal output circuit is calculated to detect the level of the ambient noise, thereby to control the gain of the sound signal output circuit; (b) an apparatus in which the ambient noise is detected only when no sound is produced from the loudspeaker so as to obtain a sound level corresponding to the ambient noise thereby to control the volume by maintaining the same level when the loudspeaker produces sound; (c) an apparatus where an ambient noise is detected by picking up a mixed sound of the ambient noise with a speaker sound by a microphone, produces a signal imitating the speaker sound from the signal outputted from the sound signal output circuit by using an adaptive filter, then subtracting the adaptive filter output signal from the microphone output signal, thereby to control the volume depending on the ambient noise level.

As for the apparatus (a), adequate control by detecting the level of the ambient noise signal component separately from the mixed signal of the ambient noise with speaker sound is difficult because the speaker sound component detected by the microphone is greatly different from the original electric signal due to phase delay of the speaker sound, frequency response of loudspeaker, and room reverberation characteristic.

As for the apparatus (b), it is far from practical. When used in a place where the ambient noise changes suddenly or periodically while the loudspeaker is producing sound, and in particular if the sound is continuous such as with music, the apparatus (b) is almost impossible to control because the loudspeaker rarely stops producing sound.

As for the apparatus (c), it functions normally when the sound source is monaural, but has difficulty detecting the ambient noise in case of stereo. Since the sum of the right and left signals is used as the input to the adaptive filter, the apparatus (c) is affected by the positions of the microphone and the loudspeakers, or shape of the room.

FIG. 1 is a block circuit diagram showing an example of a conventional automatic volume controlling apparatus of the (c) type proposed by the present inventors in the Japanese Patent Application Laid-Open No. Hei. 5-259779 (1993). In the figure, numeral 101 denotes a sound source, 104, 105, 106 denote amplifiers, 107, 108 denote loudspeakers, 109 denotes a microphone, 110, 111, 112 denote A/D converters, 113 denotes an adaptive filter, 115 denotes a subtracter, 116 denotes a level judging device for level converting the A/D converted signal and comparing the level with the reference levels 118, 120 denote signal converters for level converting the outputs of the subtracter 115 and A/D converter 112, respectively, and 121 denotes an adder for summing the outputs of the A/D converters 110, 111.

In this apparatus, by using the adaptive filter 113, an imitative loudspeaker signal added with a characteristic closely approximating a signal on route from the loudspeakers 107, 108 to the microphone 109 is canceled from the output of the microphone 109. The level of the ambient noise is obtained as the output of the signal converter 120 when a signal is not produced from the sound source 101. When a signal is produced from the sound source 101, the estimated value of the ambient noise level and the level of the mixed sound of the speaker sound with ambient noise are obtained as the outputs of the signal converters 118, 120, respectively.

FIG. 2 is a graph showing an example of the result obtained in the apparatus shown in FIG. 1, in which A indicates the level of the mixed sound of the ambient noise with speaker sound obtained by the microphone, B indicates the level of the ambient noise detected by the conventional apparatus, and C indicates the level of the ambient noise obtained by the microphone when no sound is produced by the loudspeaker. Herein, the ambient noise is imitatively reproduced by the loudspeaker and added to the speaker sound.

As clear from FIG. 2, there is a slight difference between the level B of the detected ambient noise and the level C of the ambient noise obtained when the speaker sound is not produced, so that the ambient noise is not detected correctly.

Moreover, in this prior art, although the speaker sound level can be controlled depending on the ambient noise, the volume of the speaker sound is not considered. In this kind of the automatic volume controlling apparatus, the volume is changed relative to the ambient noise level to suit the human auditory characteristic. The volume amplification degree is changed according to the level of the reproduced sound of the sound producing apparatus. That is, the higher the level of the reproduced sound from the sound producing apparatus, the smaller the volume should be amplified in response to the same ambient noise level.

One proposal is to use an automatic volume controlling apparatus capable of varying the amplification degree relative to the noise level signal depending on the volume level set by a volume changing means. FIG. 3 is a block diagram showing a conventional automatic volume controlling apparatus disclosed in the Japanese Patent Publication No. Hei. 3-13762 (1991). In the diagram, numeral 360 denotes a voltage controlled amplifier (VCA), 361 denotes a power amplifier, 362 denotes a loudspeaker, 363 denotes a noise detection circuit, 364 denotes volume controlling means, 365 denotes an adder, 366 denotes volume changing means, and 367 denotes volume setting means.

In this constitution, a sound signal is passed through the VCA 360 and power amplifier 361 and is reproduced by the loudspeaker 362. The amplification rate of the VCA 360 is controlled by the output of the adder 365. To the adder 365 are inputted the noise level signal detected by the noise detection circuit 363 via the level controlled by the volume controlling means 364, and the output from the volume setting means 376 for producing a volume level signal corresponding to the desired volume of the user on receiving a volume increase or decrease signal from the volume changing means 366. In this constitution, the volume is controlled in accordance with the noise detected by the noise detection circuit 363. The volume controlling means 364 changes the amplification degree against the noise level signal corresponding to the set volume at the time of receiving the output from the volume changing means 366. More specifically, as shown by a symbol h2 in FIG. 4, when the sound level (e2) is high, the amplification degree (g2) against the noise level is lowered to reduce the volume increase against the noise increase. As shown by a symbol h1, by contrast, when the sound level (e1) is low, the amplification degree (g1) against the noise level is raised to increase the volume increase against the noise increase, so that the volume control against the ambient noise more highly suits the auditory sense.

However, the speaker sound is actually heard, so that when the volume amplification degree is controlled depending on the volume set by the volume changing means 366, or when the volume amplification degree is controlled depending on the output from the volume controlling means 364, it is further necessary to control the volume amplification degree depending on the performance of the loudspeaker to be used. Besides, since the gain of the sound signal against the noise level is determined by representing the sound signal level with the set volume, it is impossible to avoid shortage or excess of auditory volume due to a difference in recording levels of music sources, or level changes in phrases of music.

Moreover, in the automatic volume controlling apparatus as shown in FIG. 1, the signal from the microphone 109 and the input signal to the adaptive filter 113 are usually digital signals from the A/D converter 112, but at this time since the input from the microphone to the A/D converter 112 must be within a specific range, the microphone output level must be controlled every time to the optimum value depending on the installed positions of the loudspeakers 107, 108 and microphone 109.

Incidentally, the sense of shortage of the volume due to the noise is mainly caused by masking of the sound signal by the noise. The sound signal component to be masked is larger in the frequency range of a larger noise component, and smaller in the frequency range of a smaller noise component. For example, the automobile running noise has a larger component at lower frequencies and a smaller component at higher frequencies.

Therefore, if the reproduced volume is uniformly controlled without regard to the frequency of the sound signal, as in the conventional apparatus, the effect is insufficient in the frequency range with larger noise components, but is excessive in the frequency range with smaller noise components. When such mere gain increase is done for the automobile running noise, sensation of the volume shortage in the low frequency range and sensation of the volume excess in the high frequency range are unavoidable.

As a solution, a frequency characteristic can be compensated by boosting the low frequency range of the sound signal or attenuating the high frequency range. This solution assumes the spectrum of the noise, and it may not be a sufficient solution if the noise spectrum varies.

SUMMARY OF THE INVENTION

The invention is devised to solve the above mentioned problems and it is a first object of the invention to provide an automatic volume controlling apparatus capable of automatically controlling the output volume of the loudspeaker depending on the ambient noise level detected with high precision.

It is a second object of the invention to provide an automatic volume controlling apparatus capable of automatically controlling the output volume of the loudspeaker by controlling the amplification degree of the volume depending on the level of the sound reproduced by the loudspeaker.

It is a third object of the invention to provide an automatic volume controlling apparatus capable of maintaining an appropriate volume over the entire frequency band of the sound signal by appropriately compensating the decrease of auditory volume due to the ambient noise when reproducing music.

The above and further objects and features of the invention will more fully be apparent from the following detailed description with accompanying drawings.

DESCRIPTION OF THE PREFERRED EMBODIMENTS

[Embodiment 1]

Figure 1:
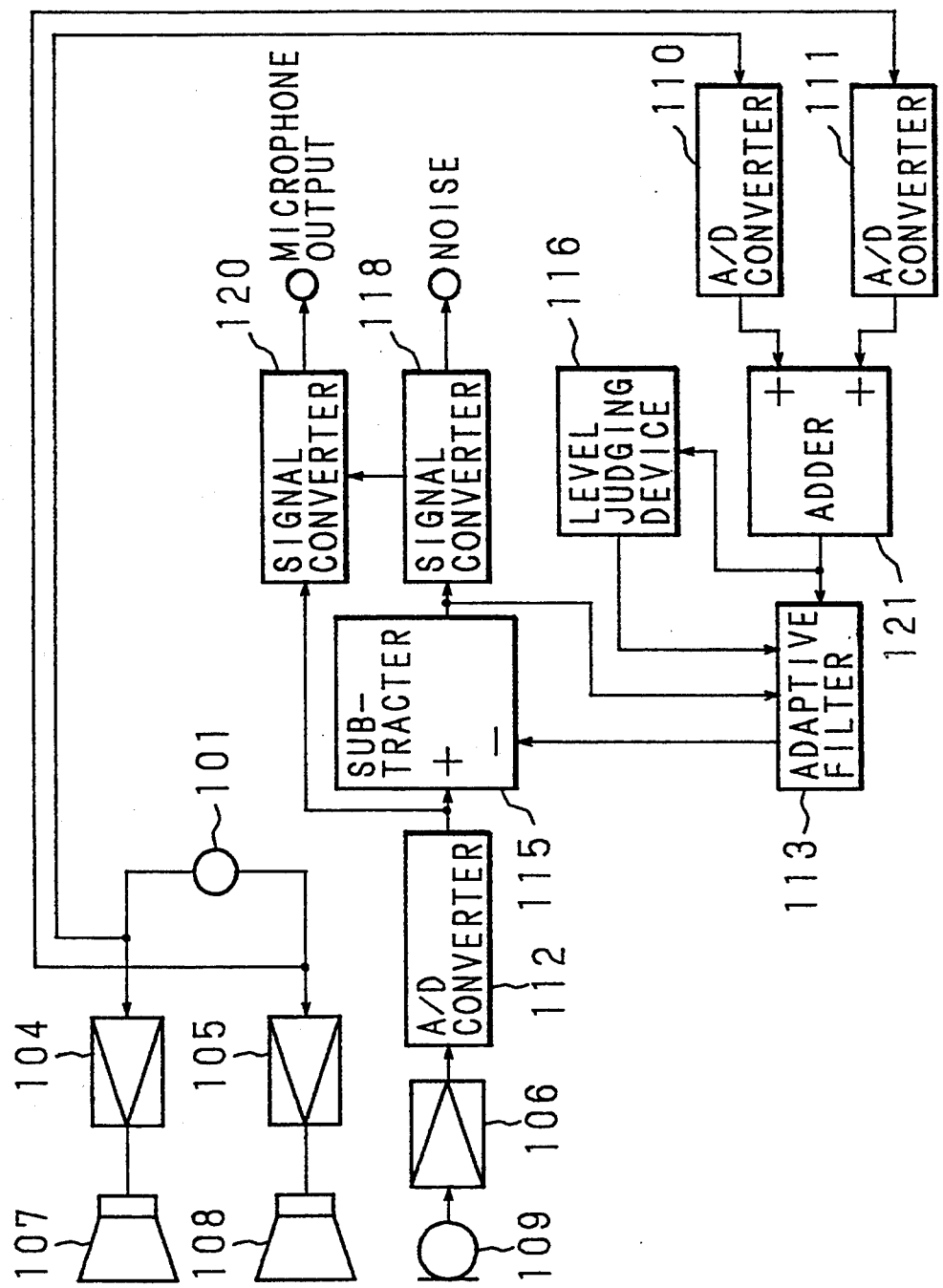
FIG. 1 is a block diagram of a conventional automatic volume controlling apparatus of the (c) type.
Figure 2:
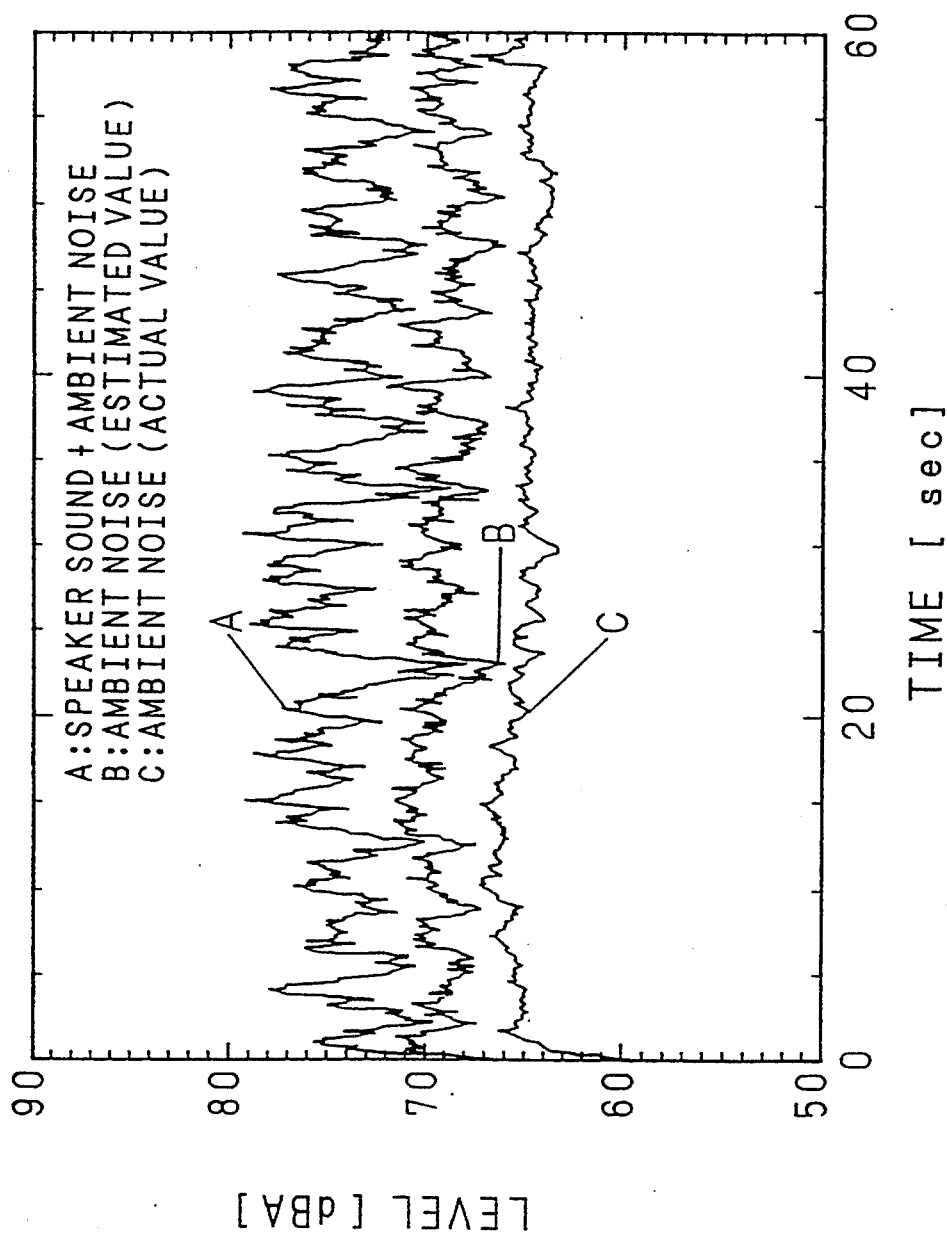
FIG. 2 is a graph showing an example of a result of the volume control by the conventional apparatus of the (c) type.
Figure 3:
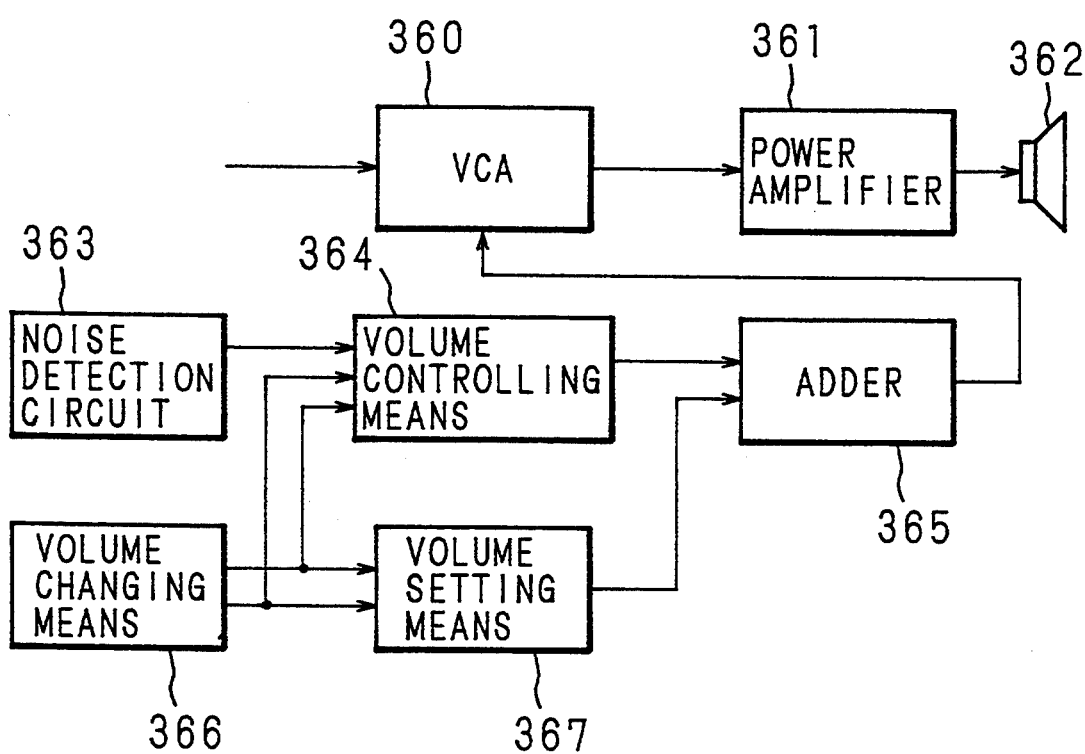
FIG. 3 is a block diagram showing another conventional automatic volume controlling apparatus.
Figure 4:
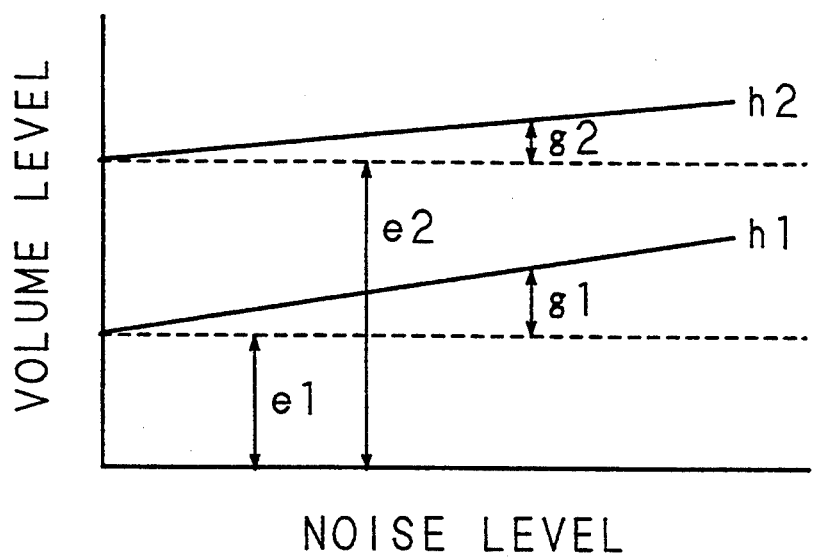
FIG. 4 is a diagram explanatory of an operation of the conventional automatic volume controlling apparatus of FIG. 3.
Figure 5:
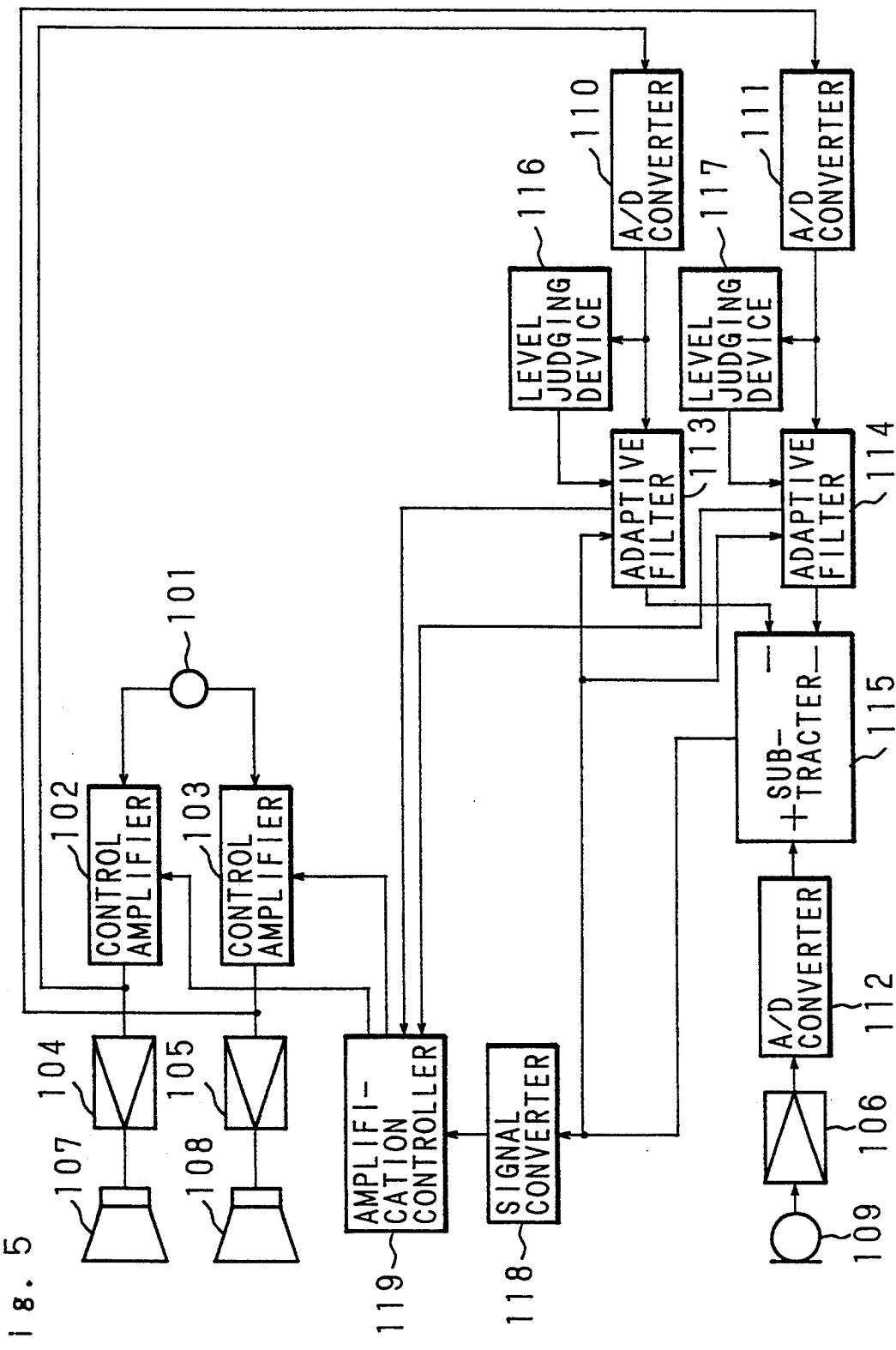
FIG. 5 is a block circuit diagram of an automatic volume controlling apparatus in Embodiment 1 of the invention.

FIG. 5 is a block circuit diagram showing Embodiment 1 of the invention, in which numeral 101 denotes a sound source, 102, 103 denote control amplifiers, 104, 105, 106 denote control amplifiers, 107 and 108 denote loudspeakers, 109 denotes a microphone, 110, 111, 112 denote A/D converters, 113, 114 denote adaptive filters, 115 denotes a subtracter, 116, 117 denote level judging devices for level converting A/D converted signals, and comparing the level with the reference level, 118 denotes a signal converter for level converting the output of the subtracter 115, and 119 denotes an amplification controller for sending an amplification control signal corresponding to the output of the signal converter 118 to the control amplifiers 102, 103.

In the automatic volume controlling apparatus according to the present invention, the right and left channel signals from the sound source 101 pass through the control amplifiers 102, 103, and are then fed to the amplifiers 104, 105 and to the A/D converters 110, 111. The outputs from the amplifiers 104, 105 are inputted to the loudspeakers 107, 108, respectively, and emitted as sound waves. The ambient noise and speaker produced sound picked up by the microphone 109 are fed into the A/D converter 112 through the amplifier 106.

The output digital signals from the A/D converters 110, 111 are fed into the adaptive filters 113, 114, respectively, to be filtered, and their outputs are fed into the subtracter 115. The output digital signal from the A/D converter 112 is also fed to the subtracter 115, and the result of subtracting both the outputs of the adaptive filters 113, 114 from the output of the A/D converter 112 is fed to the signal converter 118, and is also fed to the adaptive filters 113, 114 as coefficient updating signals.

The filtering coefficient of the adaptive filter 113 is updated so as to bring the signal from the A/D converter 110 closer to the signal which passes through the control amplifier 102 to the amplifier 104, is emitted from the loudspeaker 107 as a sound wave, is picked up by the microphone 109, and which reaches the A/D converter 112 via the amplifier 106. The filtering coefficient of the adaptive filter 114 is updated so as to bring the signal from the A/D converter 111 closer to the signal which passes through the control amplifier 103 to the amplifier 105, is emitted from the loudspeaker 108 as a sound wave, is picked up by the microphone 109, and which reaches the A/D converter 112 via the amplifier 106.

Herein, the coefficient updating algorithm for asymptotically minimizing an error signal from the subtracter 115 is known. As a result, the speaker sound component detected by the microphone 109 is canceled, and a correct ambient noise is obtained.

The input to the signal converter 118 is converted into a direct current with a time constant suitable for man's hearing characteristics (for example, a time constant used in a sound level meter), and is further logarithmically converted and outputted to the amplification controller 119 as a decibel value. Accordingly, an amplification control signal is sent from the amplification controller 119 to the control amplifiers 102, 103.

The outputs of the A/D converters 110, 111 are sent to the adaptive filters 113, 114, and also to the level judging devices 116, 117 to be converted to direct currents with a suitable time constant (e.g., approximating the time constant of the sound level meter) and compared with the reference level. When the output signal from the A/D converters 110, 111 are smaller than the reference level, signals are independently sent to the adaptive filters 113, 114 to control the adaptive filters 113, 114 to maintain the coefficients without updating. As a result, if one of the input levels of the adaptive filters 113, 114 is smaller than the reference level, only the one filter with a larger input level is actuated, while the other does not affect the estimated value. When both the inputs are smaller than the reference level, the coefficients are not updated to extraordinary values, then when a signal of a normal level is fed next time, filtering and updating of the coefficients are executed under the optimum conditions.

In this apparatus, when a signal is not outputted from the sound source 101, the level of the ambient noise is obtained as the output of the signal converter 118. When a signal is outputted from the sound source 101, an estimated value of the ambient noise level in the embodiment is obtained as the output of the signal converter 118. At this time, when the signal picked up by the microphone 109 is level converted, the level of a mixed sound of the speaker produced sound with the ambient noise is obtained.

Figure 6:
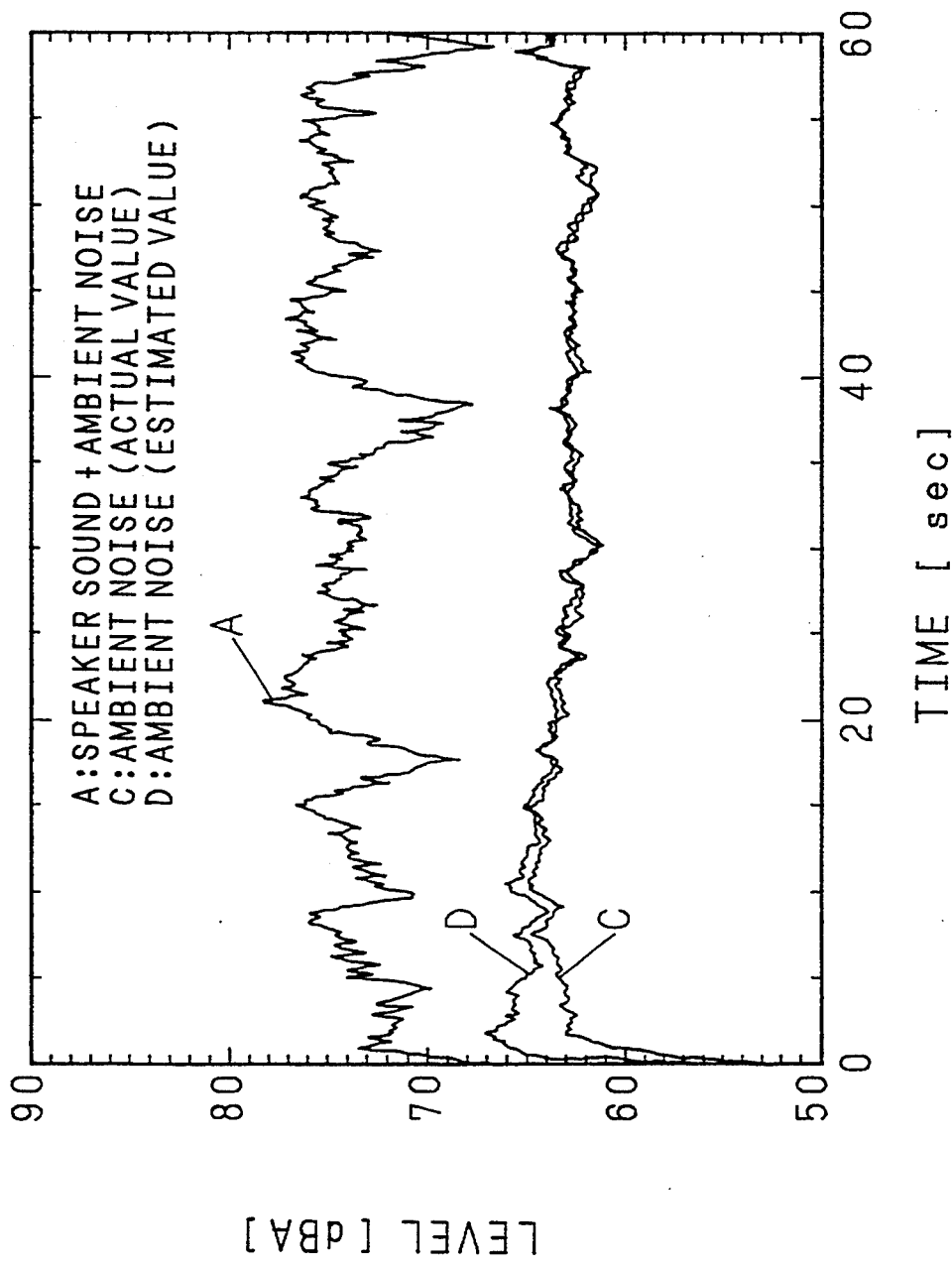
FIG. 6 is a graph showing an example of a result of the volume control in Embodiment 1 of the invention.

FIG. 6 is a graph showing an example of a result obtained by the apparatus shown in FIG. 5, in which A indicates the level of the mixed sound of the ambient noise with speaker produced sound, which is picked up by the microphone, D indicates the estimated level of the ambient noise detected in the embodiment, and C indicates the actual level of the ambient noise picked up by the microphone without producing the speaker sound. The ambient noise herein is imitatively reproduced and added by the loudspeaker.

It is apparent from FIG. 6 that the level of the ambient noise is correctly obtained in the embodiment if the signal of the sound apparatus is stereo.

Figure 7:
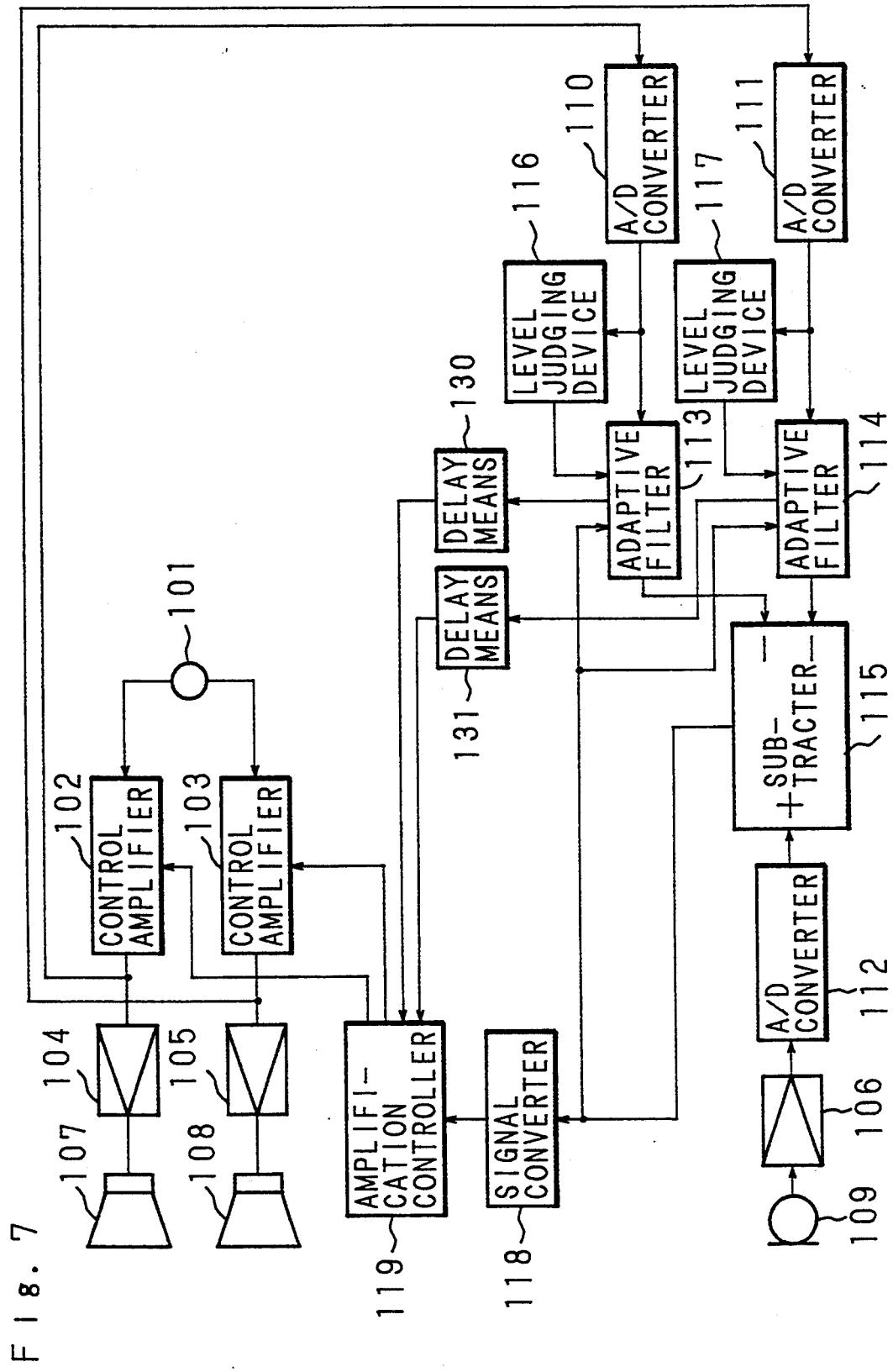
FIG. 7 is a block circuit diagram provided with delay means in Embodiment 1 of the invention.

Incidentally, delay means may be also provided for suspending the control for an appropriate time after the start of the operation of the adaptive filters 113, 114 since converting the adaptive filters 113, 114 to some degree requires some time. FIG. 7 is a block diagram showing the configuration of providing delay means 130, 131 after the adaptive filters 113, 114, respectively, and the same parts as in FIG. 5 are identified with the same reference numerals and their explanations are omitted. When starting to operate, the adaptive filters 113, 114 send the signal noticing the start of the operation to the delay means 130, 131. On receiving the signal, the delay means 130, 131 suspend the control by the control amplifiers 102, 103 for an appropriate time, and then send a control start signal to the amplification controller 119, so that the volume is not controlled for a certain time until converging to a certain extent after the start of the operation of the adaptive filters 113, 114, thereby preventing faulty operation.

In Embodiment 1, the adaptive filter 113 through the amplification controller 119 are described as independent devices, but the process by those devices may be realized by a program process using a digital signal processor (DSP).

[Embodiment 2]

Figure 8:
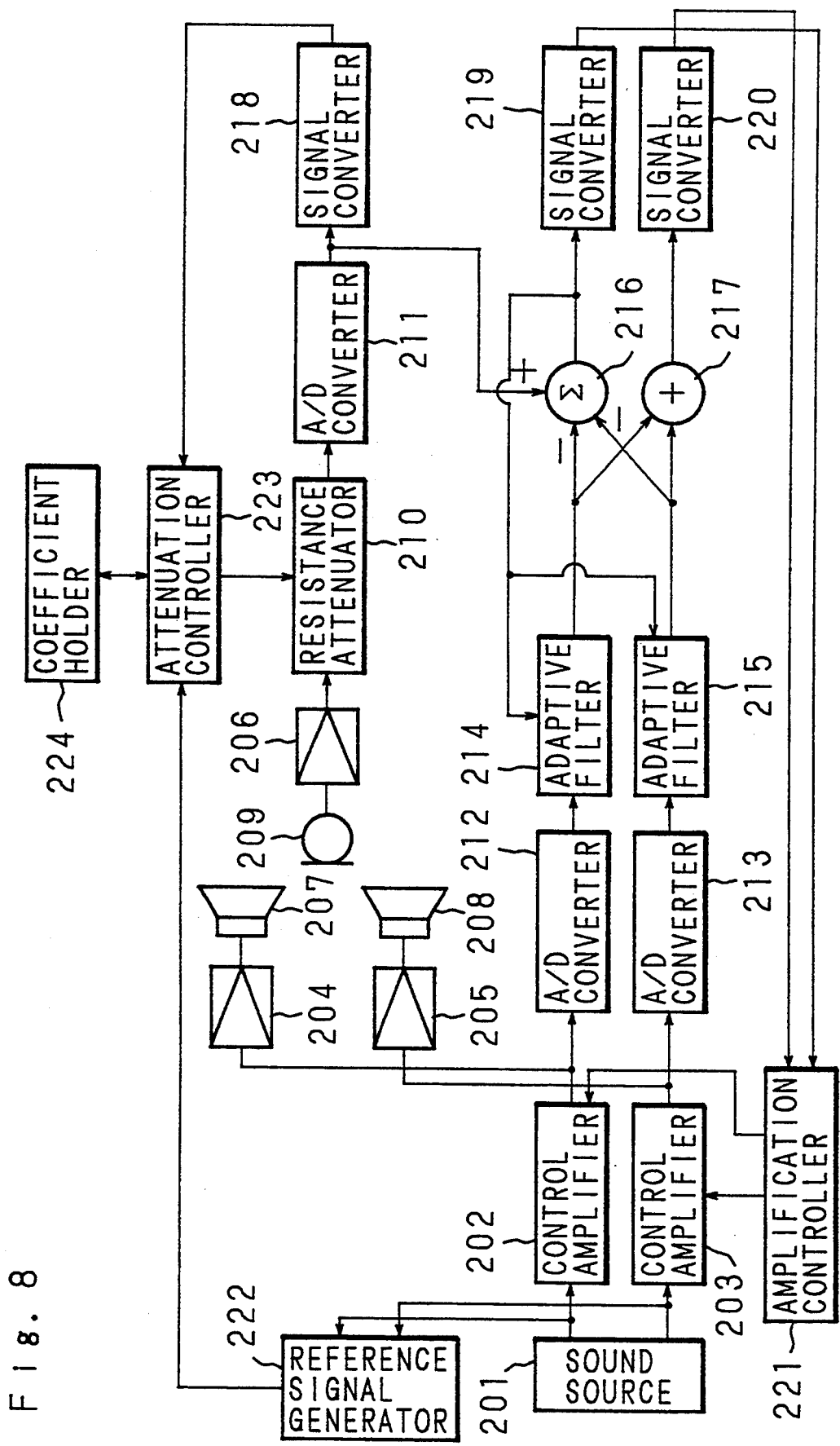
FIG. 8 is a block circuit diagram of an automatic volume controlling apparatus in Embodiment 2 of the invention.

FIG. 8 is a block circuit diagram showing an embodiment of the automatic volume controlling apparatus of the invention, in which numeral 201 denotes a sound source, 202, 203 denote control amplifiers, 204, 205, 206 denote amplifiers, 207, 208 denote loudspeakers, 209 denotes a microphone, 210 denotes a resistance attenuator, 211, 212, 213 denote A/D converters, 214, 215 denote adaptive filters, 216 denotes a subtracter, 217 denotes an adder, 218, 219, 220 denote signal converters for level converting A/D converted signal, 221 denotes an amplification controller for sending an amplification control signal depending on the outputs of the signal converters 219, 220 to the control amplifiers 202, 203, 222 denotes a reference signal generator, 223 denotes an attenuation controller for operating the reference signal generator 222 and sending an attenuation control signal corresponding to the output of the signal converter 218 at this time to the resistance attenuator 210, and 224 denotes a coefficient holder for holding the determined attenuation coefficient.

In this automatic volume controlling apparatus, the right and left channels' signals from the sound source 201 are fed both to the amplifiers 204, 205, and to the A/D converters 212, 213 through the control amplifiers 202, 203. The outputs from the amplifiers 204, 205 are supplied to the loudspeakers 207, 208, respectively, and are emitted as sound waves. The ambient noise plus speaker produced sound picked up by the microphone 209 are fed into the A/D converter 211 through the amplifier 206 and the resistance attenuator 210.

On the other hand, the output digital signals from the A/D converters 212, 213 are fed into the adaptive filters 214, 215 to be filtered, and the filtered outputs are fed to the subtracter 216 and adder 217. The output digital signal from the A/D converter 211 is also fed into the subtracter 216, from which the outputs of the both adaptive filters 214, 215 are subtracted. The subtracted result is fed into the signal converter 219, and is also fed to the adaptive filters 214, 215 as the coefficient updating signals.

The outputs of the adaptive filters 214, 215 are also fed to the adder 217, and their sum is fed into the signal converter 220.

Accordingly, the coefficient of the adaptive filter 214 is updated so as to bring the signal from the A/D converter 212 closer to the signal which passes through the control amplifier 202 to the amplifier 204, is emitted from the loudspeaker 207 as a sound wave, is picked up by the microphone 209, and which reaches the A/D converter 211 through the amplifier 206 and the resistance attenuator 210. The coefficient of the adaptive filter 215 is updated so as to bring the signal from the A/D converter 213 closer to the signal which passes through the control amplifier 203 to the amplifier 205, is emitted from the loudspeaker 208 as a sound wave, is picked up by the microphone 209, and which reaches the A/D converter 211 through the amplifier 206 and the resistance attenuator 210.

Herein, the coefficient updating algorithm for asymptotically minimizing an error signal from the subtracter 216 is known. As a result, the speaker sound component detected by the microphone 209 is canceled, and a correct ambient noise is obtained.

The inputs to the signal converters 219, 220 are respectively converted into direct currents with a suitable time constant (e.g., approximating the time constant of the sound level meter) and are further logarithmically converted and outputted to the amplification controller 221 as decibel values. Accordingly, an amplification control signal is sent from the amplification controller 221 to the control amplifiers 202, 203.

On the other hand, the output of the A/D converter 211 is sent both to the subtracter 216 and the signal converter 218. The signal converter 218 converts the output of A/D converter 211 into a direct current with a time constant approximating the time constant of the sound level meter, and further logarithmically converts and sends this direct current to the attenuation controller 223 as a decibel value.

The attenuation controller 223 usually sets the attenuation coefficient of the resistance attenuator 210 at that held by the coefficient holder 224. When gain control is requested according to the input signal to the microphone 209, the controller 223 causes the reference signal generator 222 to generate an adjustment signal. At this time, the attenuation amount of the resistance attenuator 210 is controlled so that the level of the signal emitted as sound wave by the loudspeakers 207, 208 from the control amplifiers 202, 203 through the amplifies 204, 205, picked up by the microphone 209 and inputted to the attenuation controller 223 through the resistance attenuator 210, A/D converter 211 and signal converter 218 may settle within an appropriate range, while the attenuation coefficient is held in the coefficient holder 224.

[Embodiment 3]

In Embodiment 2, the adaptive filter 214 through the amplification controller 221 are described as independent devices, but the process by the devices may be realized by a program process using a DSP.

Figure 9:
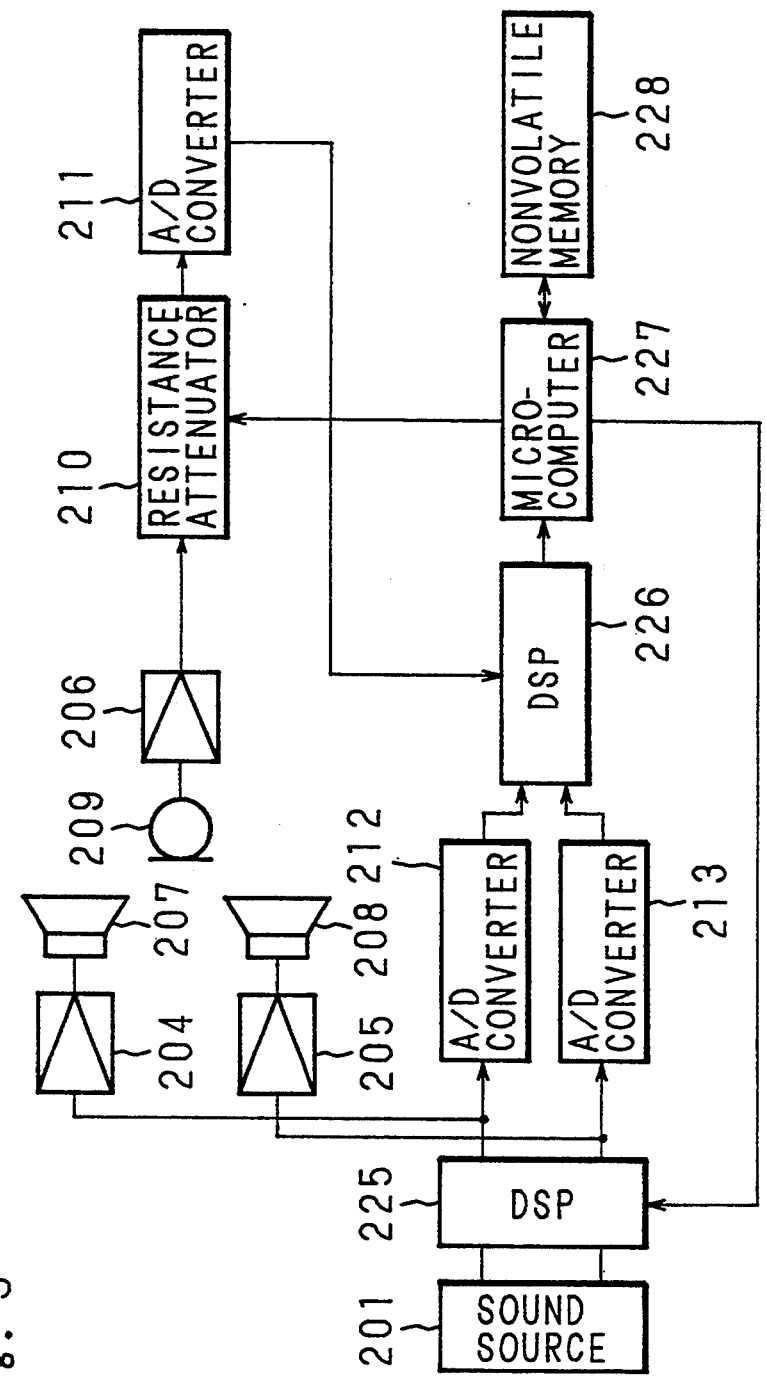
FIG. 9 is a block circuit diagram of an automatic volume controlling apparatus in Embodiment 3 of the invention.

FIG. 9 is a block circuit diagram showing another embodiment of the automatic volume controlling apparatus of the invention, in which the same parts as in FIG. 8 are identified with the same reference numerals and their explanations are omitted herein. In the figure, numeral 225 denotes a DSP for volume amplification, 226 denotes a DSP for detecting the ambient noise level and sound reproduction level by the same processing in the devices 214 through 220 in FIG. 8, 227 denotes a microcomputer, and 228 denotes a nonvolatile memory.

Figure 10:
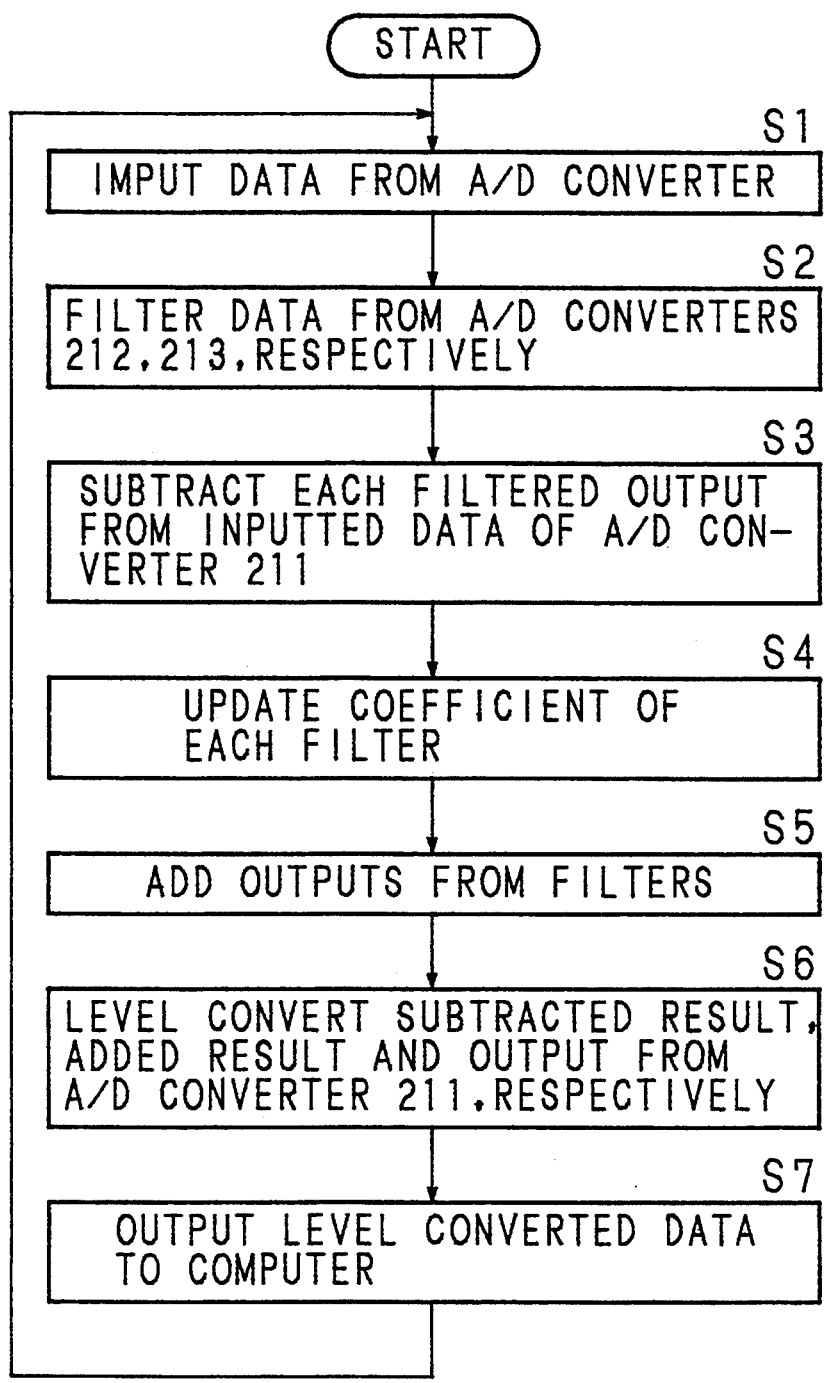
FIG. 10 is a flowchart showing an operation of a DSP for estimating the level of the ambient noise in Embodiment 3 of the invention.
Figure 11:
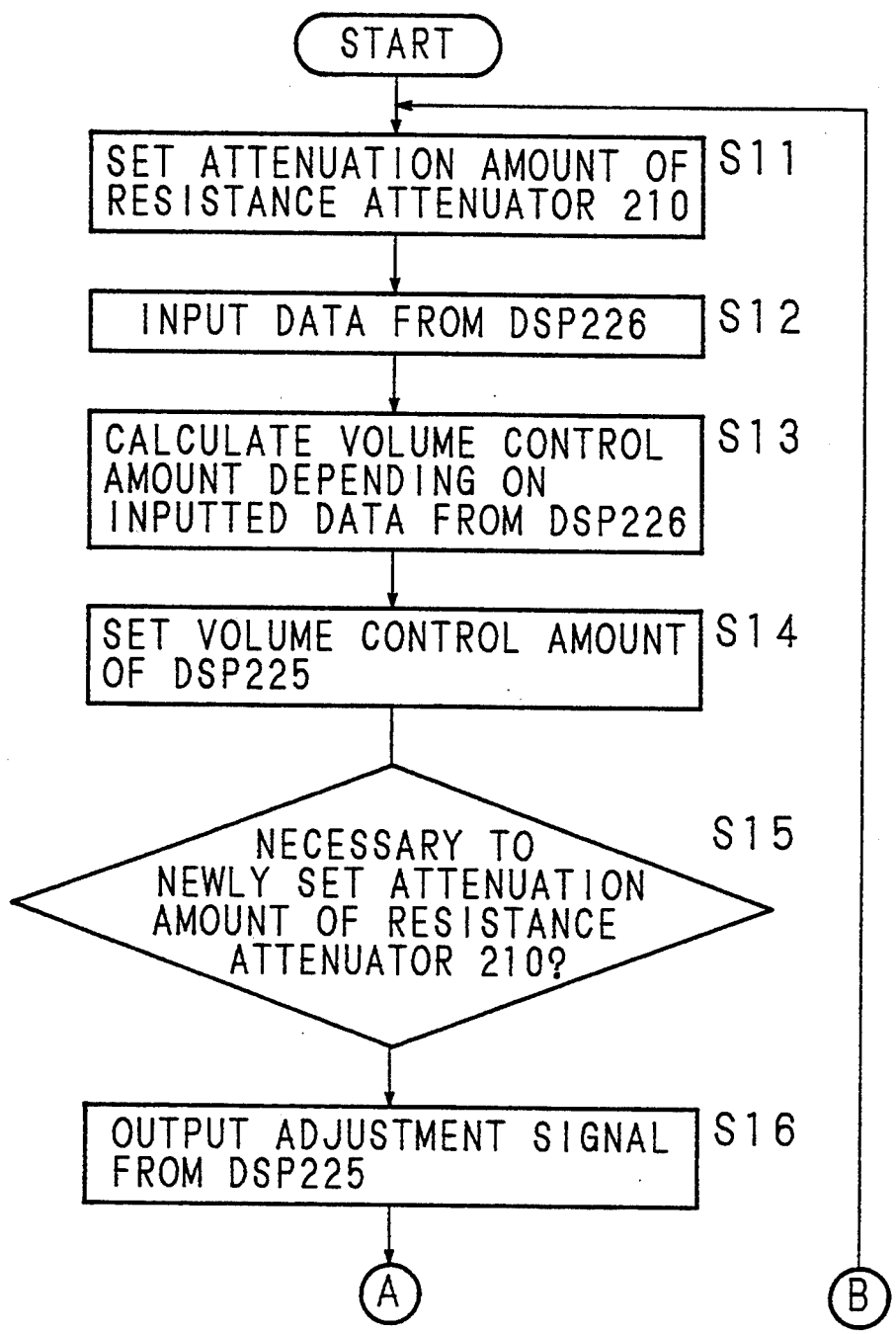
FIG. 11 is a flowchart showing an operation of a microcomputer in Embodiment 3 of the invention.
Figure 12:
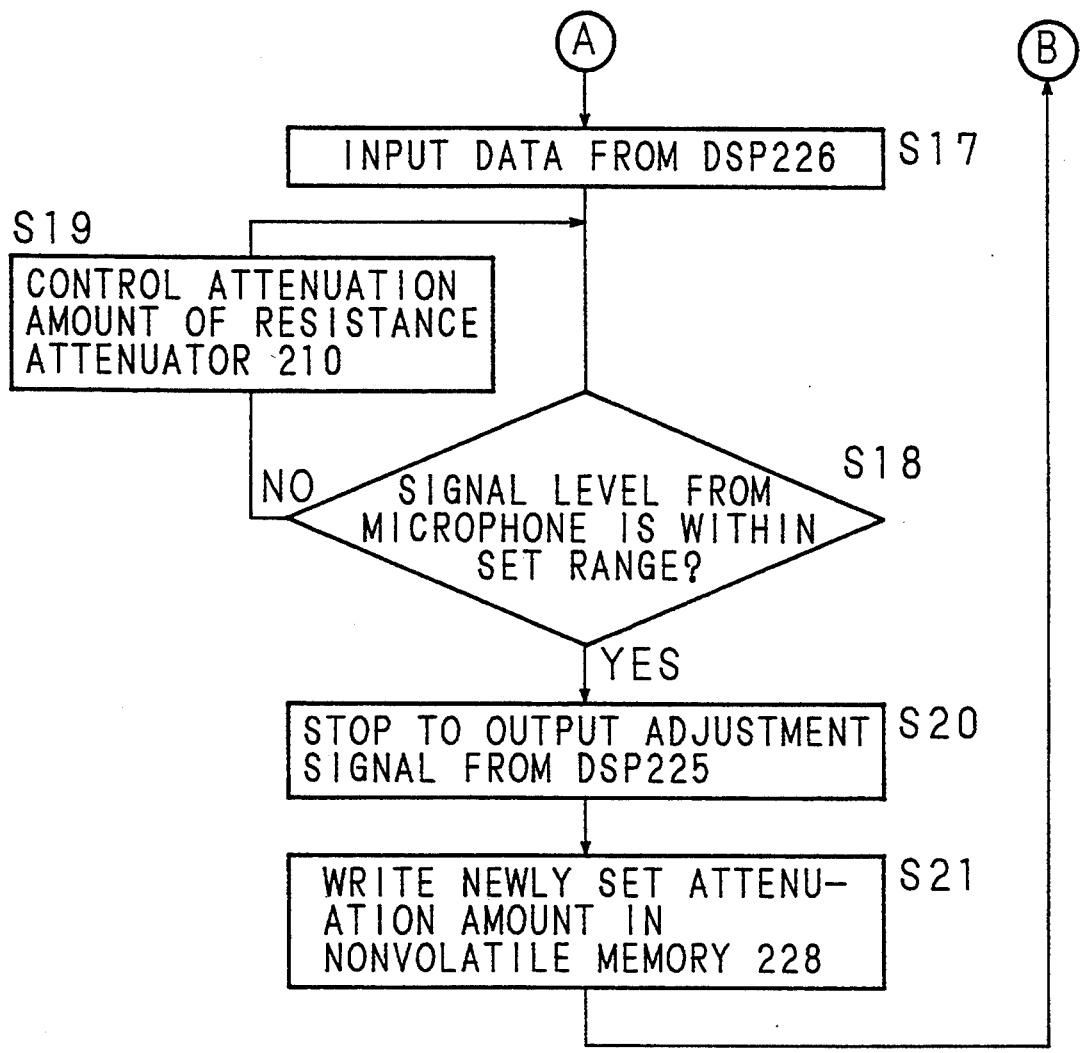
FIG. 12 is a flowchart showing an operation microcomputer in Embodiment 3 of the invention.

The operation in Embodiment 3 will be explained below with reference to FIGS. 10 and 11. FIG. 10 is a flowchart showing an operation by a program stored in the DSP 226, and FIGS. 11 and 12 are flowcharts showing an operation by a program stored in the microcomputer 227.

In this automatic volume controlling apparatus, the right and left channels' signals from the sound source 201 are fed into the amplifiers 204, 205 and the A/D converters 212, 213 via the DSP 225 for volume amplification. The outputs from the amplifiers 204, 205 are supplied to the loudspeakers 207, 208, respectively, and are emitted as sound waves. The ambient noise plus speaker produced sound picked up by the microphone 209 are fed into the A/D converter 211 via the amplifier 206 and the resistance attenuator 210.

The DSP 226 for estimating the noise level first receives the data from the A/D converters 211 through 213 when the power source is turned on as shown in FIG. 10 (S1). Then, the data of the sound reproduced by the loudspeakers 207, 208, which is received from the A/D converter 212 and A/D converter 213 are filtered by variable coefficient FIR digital filters (S2). The estimated value of the noise level is obtained by subtracting the data of the filtering result from the data of the sound picked up by the microphone 209, which is received from the A/D converter 211 (S3). By making use of the subtracted result, the coefficient of the variable coefficient filter is updated so as to bring the signals from the A/D converters closer to the signals which pass through the amplifiers 204, 205, are emitted from the loudspeakers 207, 208 as sound waves, picked up by the microphone 209, and which reach the A/D converter 211 through the amplifier 206 and the resistance attenuator 210 (S4). Further, the filtering results are summed up to detect the speaker sound level (S5). The subtracted result, the added result, and the input data from the A/D converter 211 are level converted and sent to the microcomputer 227 as a noise level, a sound reproduction level, and a microphone signal level, respectively.

Herein, the coefficient updating algorithm for asymptotically minimizing an error signal in the subtraction is known. As a result, the speaker sound component detected by the microphone 209 is canceled, and a correct ambient noise is obtained.

When the power source is turned on as shown in FIGS. 11 and 12, the microcomputer 227 first sets the attenuation amount of the resistance attenuator 210 to the value being read out from the nonvolatile memory 228 (S11). On receiving the three data, that is, the noise level, sound reproduction level, and microphone output signal level from the DSP 226 (S12), the amplification control amount is calculated from the noise level, the sound reproduction level and the set value of attenuation of the resistance attenuator 210 (S13). The amplification control amount is transmitted to the DSP 225 to vary the volume (S14). Whether or not to set the attenuation amount of the resistance attenuator 210 newly is checked (S15), and if not, the next set of data is received from the DSP 226, and the same steps S13, S14 are repeated.

When newly setting the attenuation of the resistance attenuator 210, the microcomputer 227 sends an instruction to the DSP 225 to out, put the adjustment signal to the resistance attenuator 210 (S16). When receiving the data from the DSP 226 (S17), the attenuation amount of the resistance attenuator 210 is changed depending on the microphone output signal level, which is repeated until the microphone signal level settles within an appropriate range (S17-S19). When the microphone signal level settles within an appropriate range, the microcomputer 227 instructs the DSP 225 to stop to output the adjustment signal (S20), and stores a newly set value of the attenuation amount of the resistance attenuator 210 in the nonvolatile memory 228 (S21), so that, from the next time, this value is set when the power source is turned on.

The mathematical processing for generating the adjustment signal (for example, random noise) is known, and it is not particularly difficult to execute the process by the DSP.

[Embodiment 4]

Figure 13:
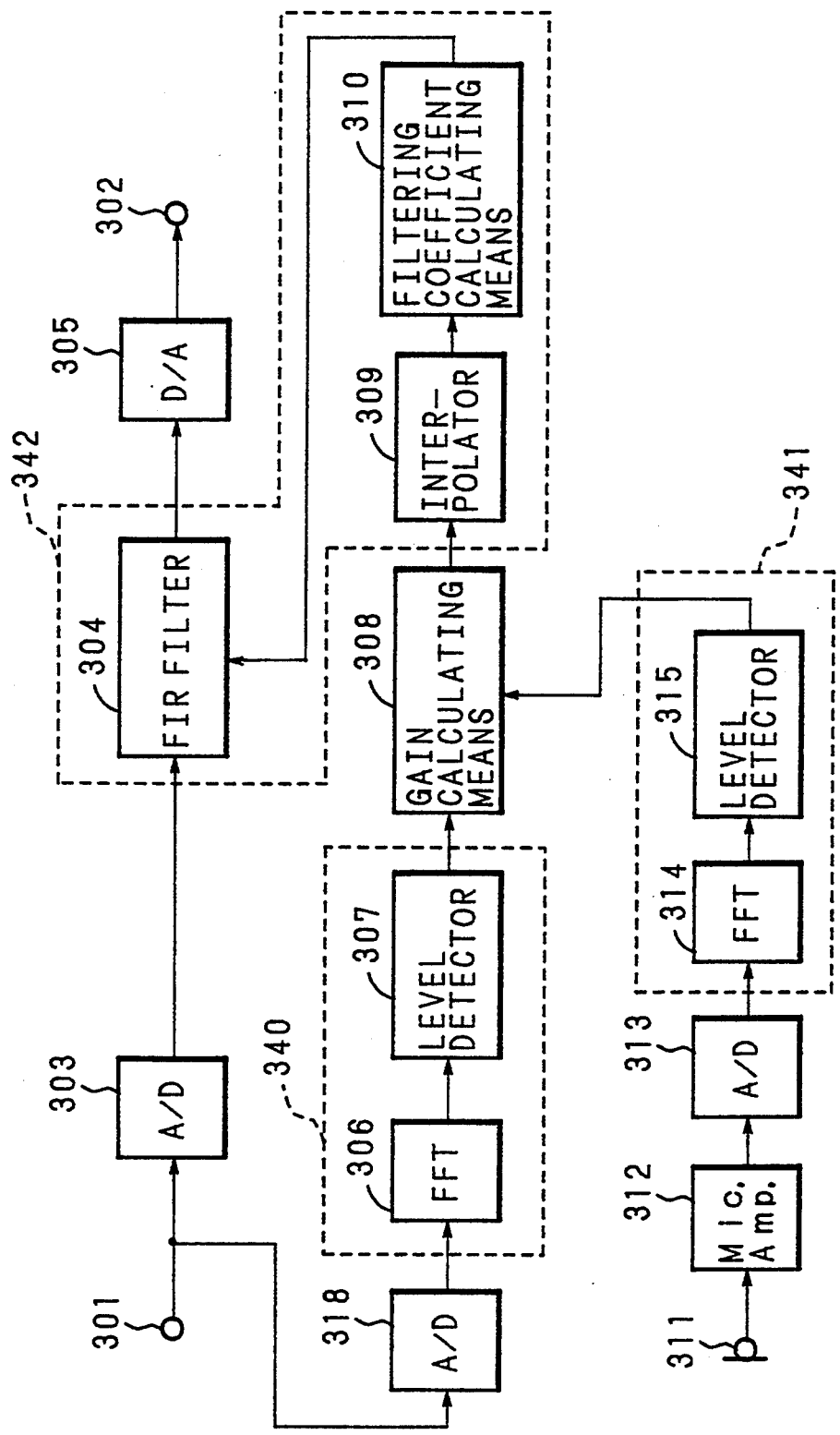
FIG. 13 is a block diagram showing an automatic volume controlling apparatus in embodiment 4 of the invention.

FIG. 13 is a block diagram showing a fourth embodiment of the automatic volume controlling apparatus of the invention. In the drawing, numeral 301 denotes an input terminal, 302 denotes an output terminal, 303 denotes an A/D converter, 304 denotes an FIR filter, 305 denotes a D/A converter, 306 denotes a first fast Fourier transformer 306 (FFT), 307 denotes a level detector, 308 denotes gain calculating means, 309 denotes an interpolator, 310 denotes filtering coefficient calculating means, 311 denotes a microphone, 312 denotes an amplifier, 313 denotes an A/D converter, 314 denotes a second FFT, 315 denotes a level detector, and 318 denotes an A/D converter. Moreover, 340 denotes sound signal analyzing means, 341 denotes ambient noise analyzing means, and 342 denotes filtering means. In this embodiment, it is assumed that the output terminal 302 is like an earphone so that the reproduced sound is hardly picked up by the microphone 311.

The inputted sound signal from the input terminal 301 is converted into a digital signal by the A/D converter 318, and is transformed by the first FFT 306 into a set of data for supplying levels of signal components of the center frequencies of the bands at equal frequency intervals. Thus the signal component level in an analysis period of every frequency band is obtained. The signal component level is equally divided into n equal bands of half the sampling frequency according to the inputted number n for the sampling data. The fast Fourier transforming method is known, and may be executed by a DSP in practical use.

Since masking of a sound signal component (spectrum) in a certain frequency is determined by the noise level included in the critical band width centered on the certain frequency, it is desired to determine the analysis frequency band of sound signal and noise by finely dividing their frequency bands to the extent of the critical band width. But the critical band width is narrow in low frequency while broad in high frequency, so that the frequency interval of the data obtained by the fast Fourier transform with equal frequency intervals is too dense in high frequency range, if the frequency interval is proper in low frequency.

The level detector 307 provides the level of the sound signal contained in each frequency band by dividing the output of the FFT 306 in appropriate frequency bands, and processes to obtain an effective value by the entire data included in the established frequency band. A satisfactory auditory performance is achieved by dividing the sound frequency band (20 Hz to 200000 Hz) into about ten bands for every octave. Incidentally, it is known that the general noise spectrum is high in level in low frequency, while low in level in high frequency (the common household noise decreases at a rate of −6 dB/oct, or the automobile internal noise at a rate from −10 dB to −12 dB per octave). Accordingly, the processing amount in the FFT may be decreased by practically narrowing the detection range in the higher frequency of the sound signal level and ambient noise level.

In the embodiment, the FFT 306 and the level detector 307 compose the sound signal analyzing means 340, but they may be replaced by plural band filters with the number thereof corresponding to that of the required frequency bands, and a level detector for detecting and smoothing the output.

The ambient noise signal obtained from the microphone 311 is amplified by the amplifier 312, converted into a digital signal by the A/D converter 313, and is transformed into level data at equal frequency intervals by the FFT 314. The level detector 315 divides the output of the FFT 314 into the appropriate number of the frequency bands to provide the level of the ambient noise signal contained in every frequency band.

In the embodiment, the FFT 314 and the level detector 315 compose the ambient noise analyzing means 341, but they may be replaced by plural band filters with the number thereof corresponding to that of the required frequency bands, and a level detector for detecting and smoothing the output.

On receiving the data output from the sound signal analyzing means 340 and the data output from the ambient noise analyzing means 341, the gain calculating means 308 determines the gain of each frequency band.

The concept of gain calculation will be explained below. The decrease of auditory volume of the sound signal due to the masking by the ambient noise is considered as the phenomenon that the origin of the sensation level in the unit of sone (hereinafter referred to as the auditory volume) shifts to the masking level (unit: sone). That is, assuming Sm to be the auditory volume with masking, S to be the auditory volume without masking, and Sth to be the auditory volume equivalent to a masking level, the following equation is satisfied.

$$Sm = S - Sth = K(I^\alpha - Ith^\alpha) \quad (1)$$

wherein I expresses sound intensity (unit: W/m$^2$), Ith expresses sound intensity K equivalent to the masking level, and $\alpha$ is a constant depending on a frequency.

The relationship between the sound pressure level P (unit: dBspl) and the sound intensity I is expressed as follows in case of a plane wave.

$$P = 10 \cdot \log(I) + 120 \quad (2)$$

Figure 14:
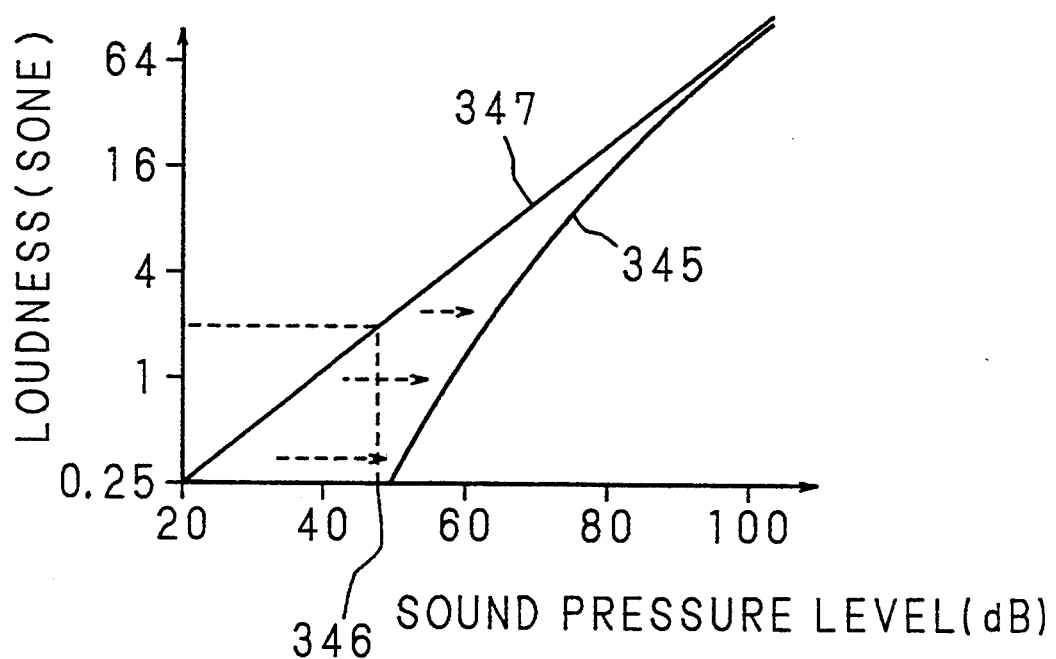
FIG. 14 is a diagram explanatory of an operation of the automatic volume controlling apparatus in Embodiment 4 of the invention.

FIG. 14 is a diagram showing the relation between the noise level and sound level, in which the curve 345 indicates the auditory volume with the ambient noise, the curve 346 indicates the masking level due to the ambient noise, and the curve 347 indicates the auditory volume without the ambient noise. Hence, in order to obtain the same auditory volume in case of having the ambient noise as in the absence of the ambient noise, it is necessary to shift the sound pressure level of the sound signal from the curve 347 to the curve 345 as indicated by an arrow in the diagram.

The gain calculating means 308 calculates the gain in each frequency band analyzed by the sound signal analyzing means to be given in order to equalize the auditory volume of the sound signal to that without the ambient noise, on the basis of the relation in FIG. 14. More specifically, first a level of a reproduced sound $P_0$ in the case without volume control is estimated from the output of the sound signal analyzing means 340, then a masking level Pt is estimated from the ambient noise level obtained from the output of the ambient noise analyzing means 341, and finally a level of a reproduced sound $P_1$ to compensate for the decrease of the auditory volume due to the masking is calculated by the following equation which is derived from the above explanatory formulas.

$$P_1 = P_0 + 10 \cdot \log\{1 + 10^{(Pt - P_0) \cdot \alpha / 10}\} / \alpha \quad (3)$$

Herein, the gain to be given to the sound signal is equivalent to $P_1 - P_0$. The value of $\alpha$ is approximately 0.3 per a pure sound of 1 kHz. Though $\alpha$ takes different values among frequencies, the value 0.3 is practically suitable for the calculation except in case of a low frequency band. For example, when dividing the frequency band of the sound into ten bands by every octave, the reproduced sound levels are calculated by substituting individual values in $\alpha$ as for three low frequency bands including 100 Hz or less, while substituting 0.3 in $\alpha$ as for the other seven bands. The calculation of the formula (3) may also be achieved by approximate calculation or by a table search according to a conversion table of the relation among $P_0$, Pt, and $P_1$, or interpolation processing by a DSP or a microcomputer.

As clear from the above explanation, the gain calculating means 308 outputs the gain to be given to each frequency band of the sound signal, and the subsequent interpolator 309, filtering coefficient calculating means 310, and FIR filter 304 compose the filtering means 342 for giving the gain-to-frequency characteristic to the sound signal.

It is known that the coefficient of the FIR filter is nearly the desired filtering impulse response. It is also known that the frequency response and the impulse response in an arbitrary filtering can be mutually converted by Fourier transform. It is also known to obtain a characteristic approximate to a desired frequency response by inverse Fourier transform of an arbitrary frequency response to obtain the impulse response, and use it as the FIR coefficient.

Herein, the filtering coefficient calculating means 310 processes the output of the interpolator 309 by inverse Fourier transform to determine the FIR filtering coefficient, and sends the coefficient to the FIR filter 304. At this time, the input to be given to the filtering coefficient calculating means 310 is the gain for each frequency being divided into n equal bands of half the sampling frequency of the sound signal, assuming the number of FIR filtering stages to be n. The interpolator 309 converts the gain determined in every, nearly the same, specific band width to the auditory characteristics in the gain calculating means 308 under the above-mentioned condition, wherein the gain for each frequency is divided to n equal bands of half the sampling frequency of the sound signal. The practical numerical processing method is known, which can be realized by a DSP or a microcomputer.

[Embodiment 5]

Figure 15:
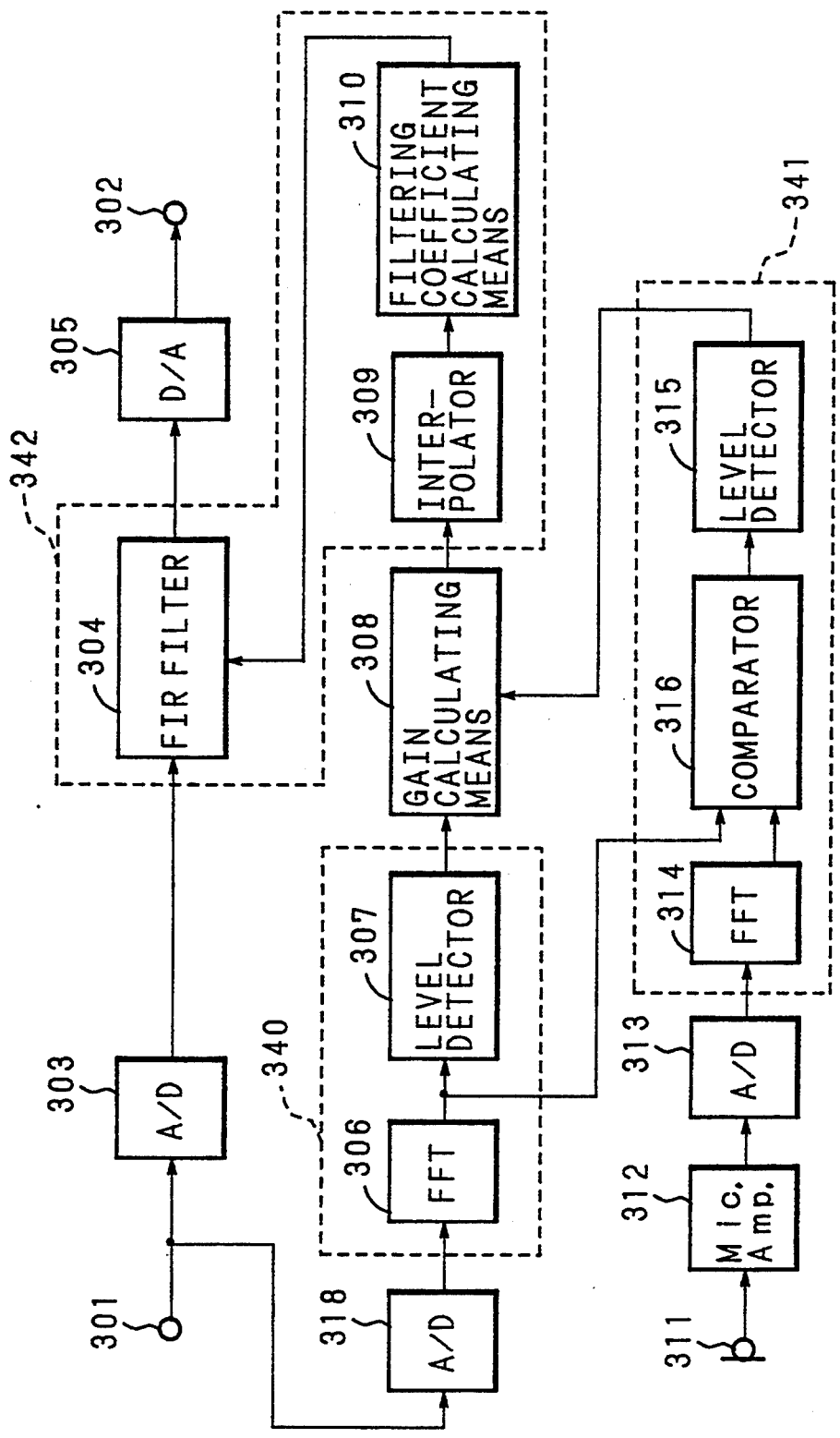
FIG. 15 is a block diagram showing an automatic volume controlling apparatus in Embodiment 5 of the invention.

FIG. 15 is a block diagram showing a fifth embodiment of the an automatic volume controlling apparatus of the invention. In the diagram, numeral 301 denotes an input terminal, 302 denotes an output terminal, 303 denotes an A/D converter 304 denotes an FIR filter, 305 denotes a D/A converter, 306 denotes an FFT, 307 denotes a level detector, 308 denotes gain calculating means, 309 denotes an interpolator, 310 denotes filtering coefficient calculating means, 311 denotes a microphone, 312 denotes an amplifier, 313 denotes an A/D converter, 314 denotes an FFT, 315 denotes a level detector, 316 denotes a comparator, and 318 denotes an A/D converter. Further, numeral 340 denotes sound signal analyzing means, 341 denotes ambient noise analyzing means, and 342 denotes filtering means.

In this embodiment, as compared with Embodiment 4 where the reproducing means of the sound signal is an earphone or the like by which the reproduced sound is hardly picked up by the microphone for picking up the ambient noise, the sound reproducing means is a loudspeaker or the like, and the reproduced sound is picked up by the microphone together with the ambient noise.

As in Embodiment 4, the FFT 306 outputs the sound signal component levels of frequency bands at equal frequency intervals, and the FFT 314 outputs the ambient noise signal component levels of the frequency bands at the same equal frequency intervals as in the FFT 306. In this embodiment, the comparator 316 compares the identical frequency component levels of the FFTs 306 and 314, and the corresponding output of the FFT 314 is directly outputted when the output level of the FFT 314 is sufficiently higher than the output level of the FFT 306, which is the estimated level of the sound signal component reproduced by the loudspeaker or the like and picked up by the microphone. If not, one of the following processings is performed: output the previously outputted value again (previous value hold); output a prescribed value for each band; output the same value as the smaller one of the levels of the adjacent bands; output the value one prescribed value smaller than the previous outputted value. By this processing, a subsequent erroneous volume control on a mistake of the reproduced sound from the loudspeaker or the like for the noise can be avoided.

The reason that the ambient noise is detected by such processing of the comparator 316 will be explained below. In the FFTs 306 and 314, the frequency band is subdivided, so that a high sound signal level scarcely appears in a specific band. On the other hand, the ambient noise often has a continuous frequency spectrum, so that a certain level often appears in each of the divided bands. Accordingly, when the sound signal level is sufficiently low, the ambient noise is surely detected. In several bands, moreover, if the above-mentioned processing is done, even though the noise level cannot be detected, the correct noise level is probably obtained, on the whole.

In this embodiment, the outputs of the FFTs 306 and 314 are compared by the comparator 316 to detect the ambient noise level, but if the produced sound level is approximately known beforehand, (by comparing the output of the FFT 306 with the prescribed value in each band) the output of the FFT 314 may be directly outputted when the output of the FFT 306 is smaller than the prescribed value. If the output of the FFT 306 is larger than the prescribed value, one of the following processings is executed: output the previous output again (previous value hold); output a specified value in each band; output the same value as the smaller one of the levels of the adjacent bands; output the value one prescribed value smaller than the previous outputted value.

Figure 16:
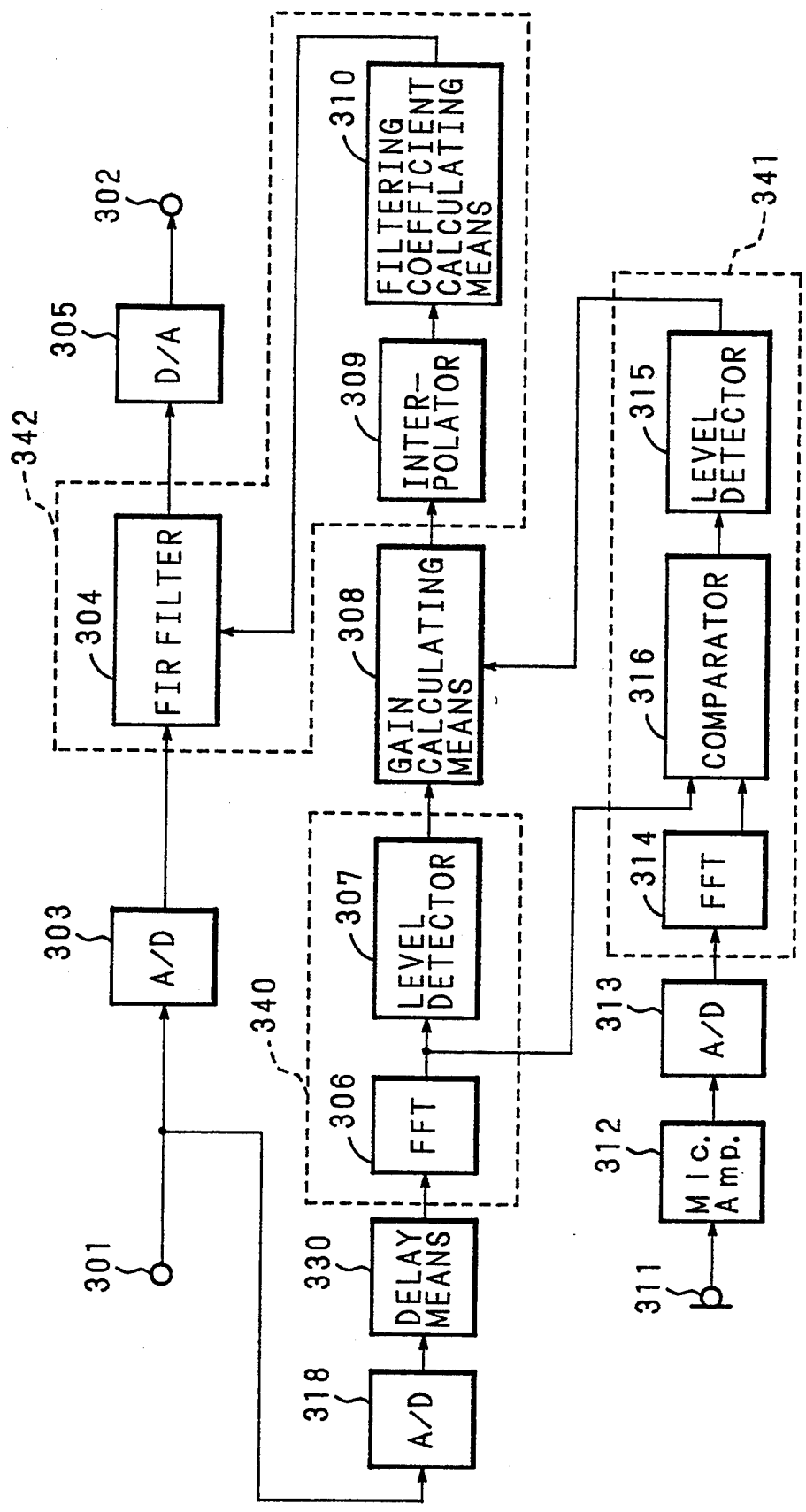
FIG. 16 is a block diagram provided with delay means before sound signal analyzing means in Embodiment 5 of the invention.

In Embodiment 5, in order to eliminate the effect of the reproduced sound signal into the microphone 311, the outputs of the FFTs 306 and 314 are compared by the comparator 316. But, since the sound signal into the microphone 311 propagates through the space from the electro-sound converting means such as loudspeaker before reaching the microphone 311, there occurs a time delay corresponding to the distance between the loudspeaker and microphone 311. To avoid the mistake of the sound signal for the ambient noise, it is necessary to compare the levels of the sound signals contained in the outputs of the FFTs 306 and 314 in the same timing by delaying the outputs from the FFT 306. FIG. 16 is a block diagram showing the configuration with delay means for providing the first FFT 306 an appropriate delay time, and the same parts as in FIG. 15 are identified with the same reference numerals and explanations are omitted. In case where the distance between the microphone and loudspeaker is far, the levels of the sound signals contained in the outputs of the FFTs 306 and 314 may be compared in the same timing with the FFT 306 by applying the delay corresponding to this distance to the route on the sound signal level detection side, that is, to the FFT. 306.

Figure 17:
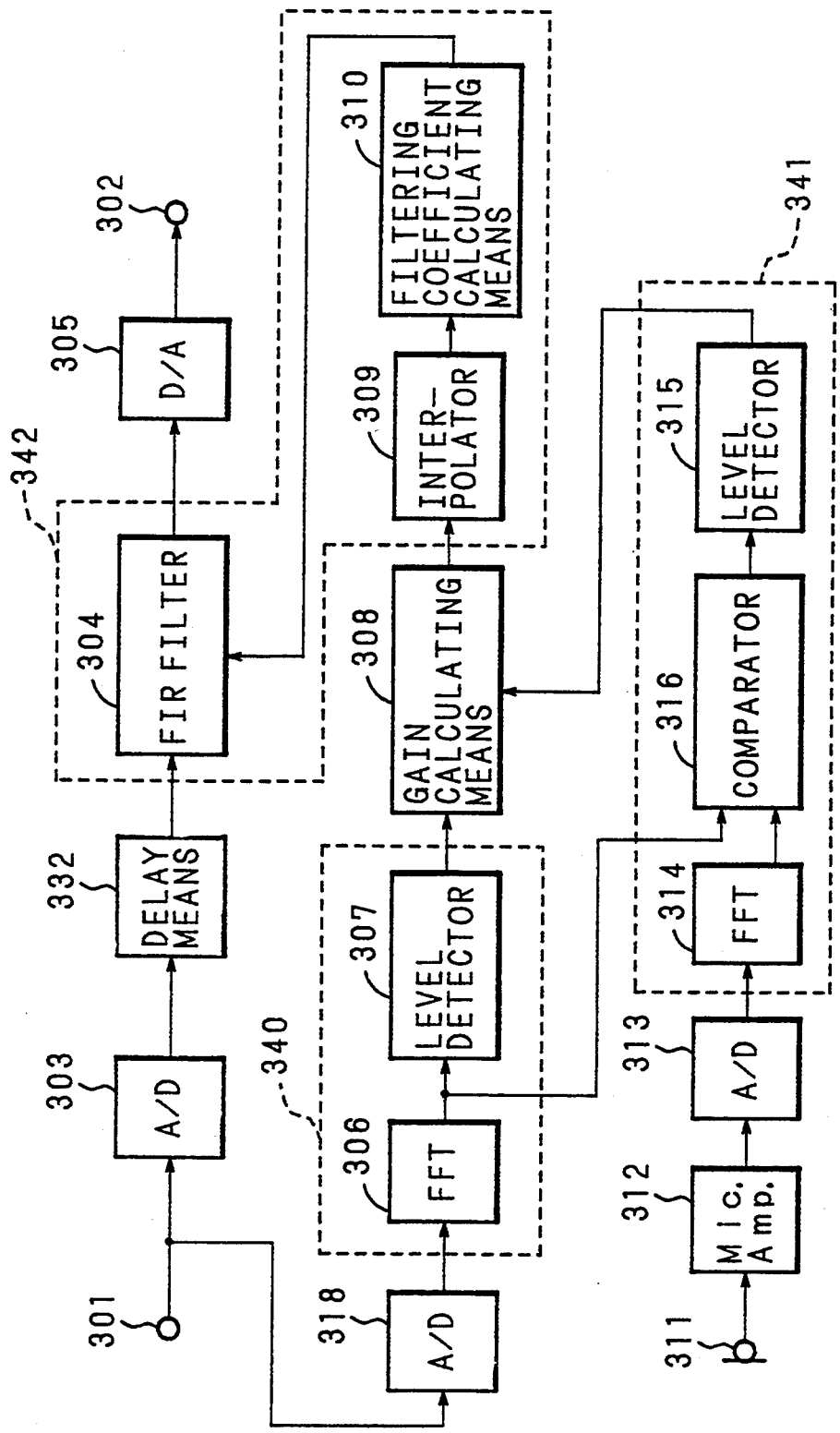
FIG. 17 is a block diagram provided with delay means before sound signal filtering means in Embodiment 5 of the invention.

In detecting the levels of the sound signal and ambient noise by the fast Fourier transform, since it is necessary to analyze the data block in a definite time relating to the frequency resolution, it takes a certain time to obtain the result to delay the volume control by this certain time. The volume is controlled by the sound signal level and ambient noise level, as mentioned above, and usually delay in following up the ambient noise level does not matter too much. However, if the gain decrease control delays when the sound signal level suddenly raises, the sound is temporarily reproduced at an unnecessarily high level, which causes great discomfort to listeners. To avoid this, it is proper to provide delay means 332 for delaying the volume control by the time corresponding to this detection delay time before the filtering means 342 on the sound signal route (see FIG. 17). Yet, since the delay given by the delay means 332 is equal to the time where a delay occurring by the processing in the filtering means 342 is subtracted from the required delay, an extra delay is unnecessary if the delay by the FIR filter 4 is sufficiently large.

[Embodiment 6]

Figure 18:
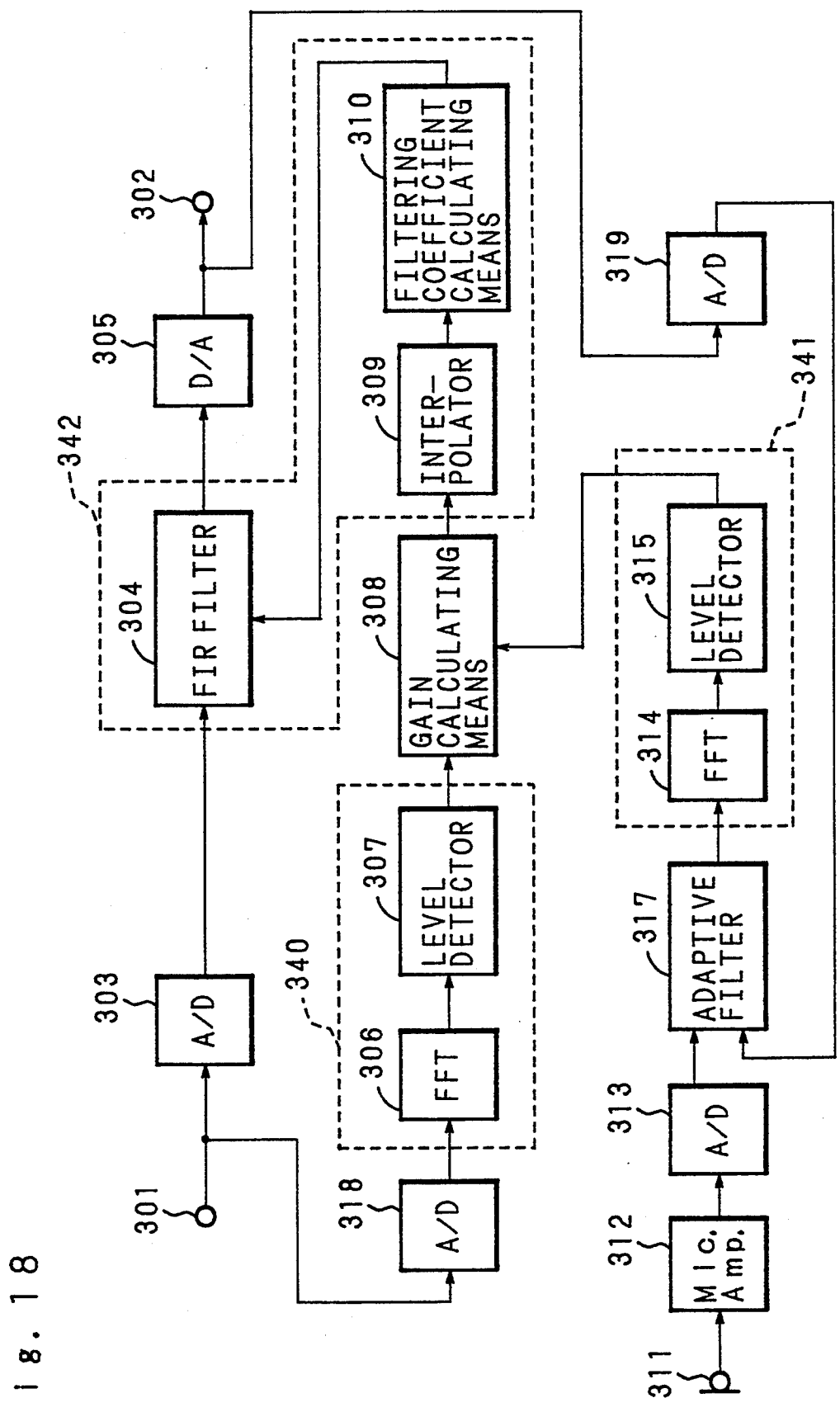
FIG. 18 is a block diagram showing an automatic volume controlling apparatus in Embodiment 6 of the invention.

FIG. 18 is a block diagram showing a sixth embodiment of the automatic volume controlling apparatus of the invention. In the diagram, numeral 301 denotes an input terminal, 302 denotes an output terminal, 303 denotes an A/D converter, 304 denotes an FIR filter, 305 denotes a D/A converter, 306 denotes an FFT, 307 denotes a level detector, 308 denotes gain calculating means, 309 denotes an interpolator, 310 denotes filtering coefficient calculating means, 311 denotes a microphone, 312 denotes an amplifier, 313 denotes an A/D converter, 314 denotes an FFT, 315 denotes a level detector, 316 denotes a comparator, 317 denotes adaptive filtering means, and 318 and 319 denote A/D converters. Numeral 340 denotes sound signal analyzing means, 341 denotes ambient noise analyzing means, and 342 denotes filtering means.

Herein, the parts having the same reference numerals as in Embodiments 4 and 5 operate in the same manner. In this embodiment, same as in Embodiment 5, the sound reproducing means is a loudspeaker or the like, and the reproduced sound is picked up by the microphone together with the ambient noise. The adaptive filter 317, same as in Embodiment 5, receives both the ambient noise signal obtained by amplifying and A/D converting the output of the microphone 311, and the sound signal having a correlation as high as possible with the sound signal reproduced by the loudspeaker (hereinafter referred to as a reference sound signal; in FIG. 18, the output of the D/A converter 305 converted into a digital signal by the A/D converter 319 is used as the reference sound signal). The adaptive filter 317 removes the component correlated with the reference sound signal, that is, the reproduced sound component by the loudspeaker from the mixed signal of the sound and ambient noise or the like, so as to output only the ambient noise.

Figure 19:
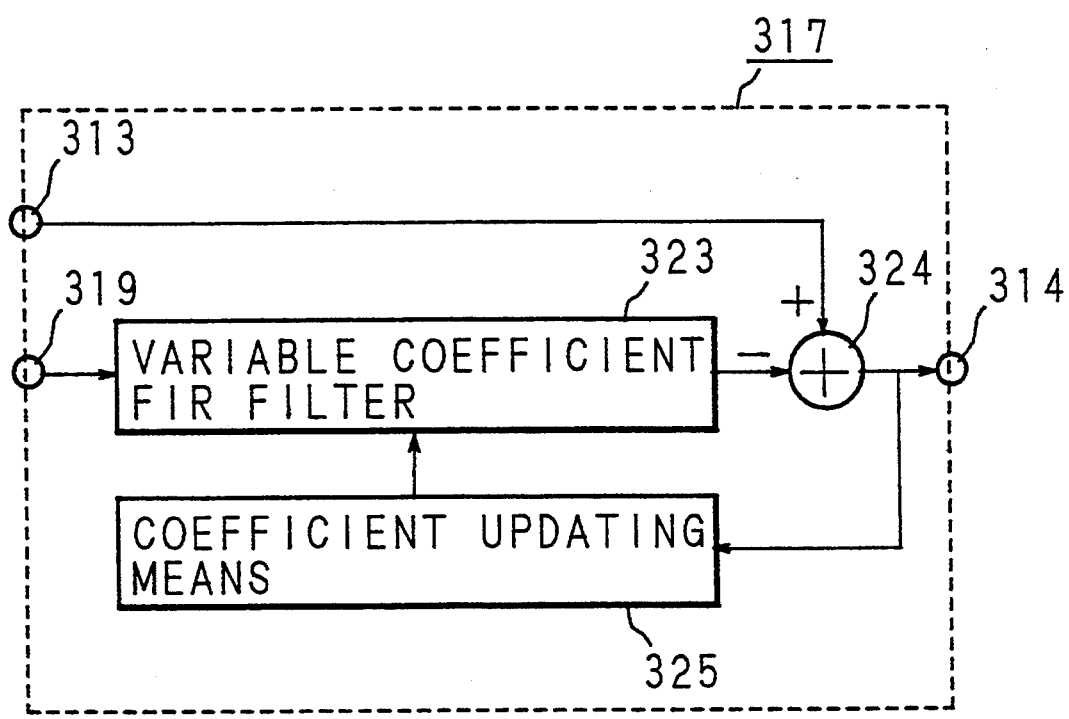
FIG. 19 is a block diagram showing the configuration of adaptive filtering means in Embodiment 6 of the invention.

FIG. 19 is a block diagram showing the constitution of the adaptive filter 317 in the sixth embodiment of the invention, in which numeral 323 denotes a variable coefficient FIR filter, 324 denotes a subtracter, and 325 denotes coefficient updating means. The adaptive filter 317 in this constitution is known. The subtracter 324 subtracts the reference sound signal passing through the variable coefficient FIR filter 323 from the mixed signal of the sound and ambient noise. The coefficient updating means 325 updates the coefficient of the variable coefficient FIR filter 323 so as to minimize an error signal outputted from the subtracter 324. By this coefficient updating, the variable coefficient FIR filter 323 consequently imitates the transmission characteristics of the route through the D/A converter to the power amplifier via the output terminal 302, the electro-acoustic converter such as the loudspeaker, sound emitted space, and the microphone (where the sound signal obtained from the microphone passes after the reference sound signal pickup point). In other words, the variable coefficient FIR filter 323 transforms the reference sound signal to be equivalent to the sound signal component contained in the mixed signal of the sound and ambient noise, by convolving the characteristic which imitates the transmission characteristic of the route from reproduction to pickup of the sound signal into the reference sound signal.

Figure 20:
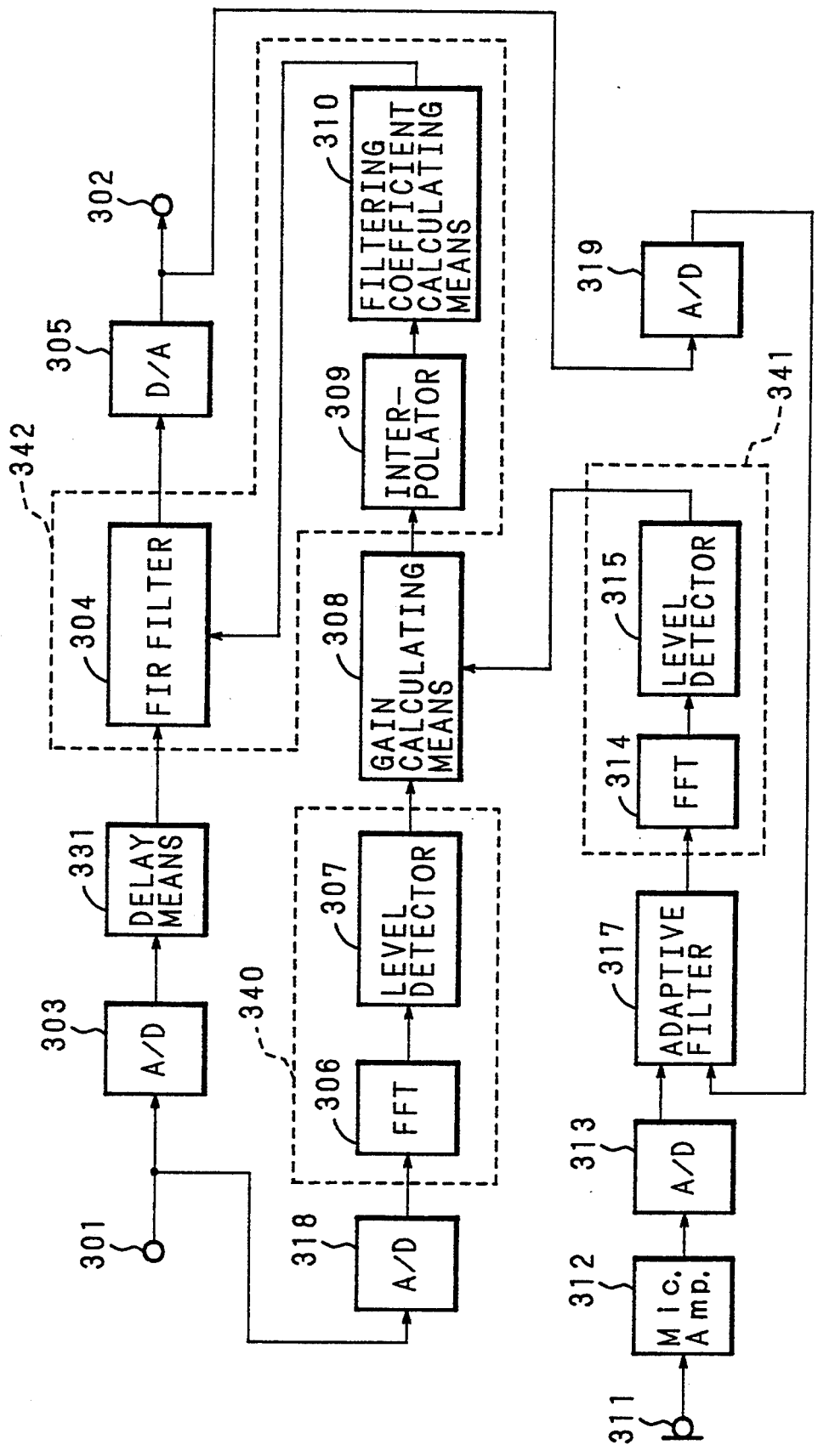
FIG. 20 is a block diagram having delay means in Embodiment 6 of the invention.

As mentioned above, when detecting the levels of the sound signal and ambient noise by the fast Fourier transform, it takes a certain time to obtain the result. This delay occurs due to analyzing the data block of a definite time relating to the frequency resolution. Because of this delay, the sound is temporarily reproduced at a level higher than necessary, which causes great discomfort to listeners. To avoid this, it is proper to delay the volume control by the time corresponding to this detection delay before the filtering means 342 on the sound signal route. FIG. 20 is a block diagram of the constitution with delay means 331 before the filtering means 342, and the same parts as in FIG. 18 are identified with the same reference numerals and explanations are omitted. The delay means 331 gives a signal to the filtering means 342 by delaying the timing of the volume control to prevent the sound from being temporarily reproduced at a higher level than necessary. However, since the delay given by the delay means 331 is equal to the time where delay occurring in the filtering means 342 is subtracted from the required delay, an extra delay is unnecessary if the delay in the FIR filter 4 is large.

In the embodiments 4 through 6, the FIR filter 304, FFT 306, level detector 307, gain calculating means 308, interpolator 309, filtering coefficient calculating means 310, level detector 315, and adaptive filter 317 are mentioned as independent devices, but the processes by those devices may be sequentially executed and processed by the DSP. Besides, if all of the processes cannot be executed by a single DSP due to the restriction in capabilities or the like, it is possible to distribute and process by plural DSPs or microcomputers.

In such cases, the A/D converters 313, 318, 319 may time share a single element.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An apparatus for automatically controlling a volume of sound produced by loudspeakers, depending on the volume of ambient noise, comprising:
    a microphone for picking up 2-channel mixed sounds including sound produced by the loudspeakers and ambient noise;
    adaptive filtering means having variable filtering coefficients, receiving a same set of 2-channel input signals that are inputted to the loudspeakers, for adaptively filtering the 2-channel input signals;
    subtracting means for respectively subtracting outputs of the adaptive filtering means, corresponding to the 2-channel sounds, from the mixed sounds including the sounds from the loudspeakers and the ambient noise;
    means, responsive to outputs from the subtracting means, for updating the filtering coefficients of the adaptive filtering means to minimize the output signal from the subtracting means; and
    means for controlling the volumes of the loudspeakers depending on the outputs from the subtracting means.

2. An automatic volume controlling apparatus of claim 1, further comprising means for stopping an update of the filtering coefficients of the adaptive filtering means when a level of the 2-channel mixed sounds is lower than a reference level.

3. An automatic volume controlling apparatus of claim 1, further comprising means for delaying a start of volume control after the adaptive filtering means starts to operate until the adaptive filtering means converges.

4. An automatic volume controlling apparatus of claim 1 wherein the means for controlling the volumes includes a digital signal processor.

5. An automatic volume controlling apparatus of claim 1 wherein the adaptive filtering means includes a digital signal processor.

6. An automatic volume controlling apparatus of claim 1, further comprising:
    means for attenuating signals picked up by the microphone;
    means for controlling a gain of the attenuating means according to the volume of the loudspeakers; and
    means for holding the gain of the attenuating means.

7. An automatic volume controlling apparatus of claim 6 wherein the gain holding means holds the gain even after the power is cut off.

8. An automatic volume controlling apparatus of claim 6 wherein the gain controlling means includes a microcomputer.

* * * * *